(12) United States Patent
Ishizu et al.

(10) Patent No.: US 9,443,564 B2
(45) Date of Patent: Sep. 13, 2016

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takahiko Ishizu, Kanagawa (JP); Wataru Uesugi, Kanagawa (JP); Kiyoshi Kato, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/993,375

(22) Filed: Jan. 12, 2016

(65) Prior Publication Data

US 2016/0217848 A1    Jul. 28, 2016

(30) Foreign Application Priority Data

Jan. 26, 2015   (JP) ................................ 2015-012635

(51) Int. Cl.
*G11C 5/14* (2006.01)
*G11C 14/00* (2006.01)

(52) U.S. Cl.
CPC .................. *G11C 5/148* (2013.01); *G11C 5/14* (2013.01); *G11C 14/0054* (2013.01)

(58) Field of Classification Search
CPC ......... G11C 5/14; G11C 5/143; G11C 5/148; G11C 14/0054
See application file for complete search history.

(56) References Cited

U.S. PATENT DOCUMENTS

| | | | |
|---|---|---|---|
| 5,691,948 A * | 11/1997 | Sakabe | .................. G11B 19/06 365/226 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Harry W Byrne
*Assistant Examiner* — Lance Reidlinger
(74) *Attorney, Agent, or Firm* — Fish & Richardson P.C.

(57) ABSTRACT

To provide a semiconductor device having a novel structure. To provide a semiconductor device excellent in reducing power consumption. A memory cell including an SRAM capable of backing up data to the nonvolatile memory and a peripheral circuit of the memory cell are configured to offer different power gating states. In a first period, which is extremely short, the bit line is brought into an electrically floating state by turning off the switch. In a second period, which is longer than the first period, power gating is performed on the memory cell. In a third period, which is longer than the second period, power gating is performed on the memory cell and the peripheral circuits.

8 Claims, 21 Drawing Sheets

(56) References Cited

U.S. PATENT DOCUMENTS

| | | | |
|---|---|---|---|
| 6,727,522 B1 | 4/2004 | Kawasaki et al. | |
| 7,023,757 B2 * | 4/2006 | Watanabe | G06F 1/3203 365/226 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,626,883 B2 * | 12/2009 | Shimano | G11C 5/063 365/185.13 |
| 7,674,650 B2 | 3/2010 | Akimoto et al. | |
| 7,732,819 B2 | 6/2010 | Akimoto et al. | |
| 8,787,073 B2 | 7/2014 | Yamazaki et al. | |
| 8,787,102 B2 | 7/2014 | Ishizu | |
| 8,964,450 B2 * | 2/2015 | Ishizu | 365/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0191673 A1 | 7/2013 | Koyama et al. | |
| 2013/0297874 A1 | 11/2013 | Kurokawa et al. | |
| 2013/0301331 A1 | 11/2013 | Onuki et al. | |
| 2014/0068300 A1 | 3/2014 | Nishijima et al. | |
| 2014/0328111 A1 | 11/2014 | Yamazaki et al. | |
| 2015/0269977 A1 * | 9/2015 | Ishizu | G11C 11/419 365/154 |

FOREIGN PATENT DOCUMENTS

| | | |
|---|---|---|
| JP | 60-198861 A | 10/1985 |
| JP | 63-210023 A | 6/1988 |
| JP | 63-210022 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-008436 A | 1/2013 |
| JP | 2013-008437 A | 1/2013 |
| JP | 2013-009285 A | 1/2013 |
| WO | WO-2004/114391 | 12/2004 |

OTHER PUBLICATIONS

Meiboom.S et al. "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M. "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09: SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap etectrically conducting amorphous oxides and examples". J. Non-Cryst. Solids (Journal of Non-Crystalline Solids), 1996, vol. 198-200, pp. 165-169.
Orita.M et al., "Mechanism of Electrical Conductivity of Transparent InGaZnO4". Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Harfree-Fock density Functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2006. vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 161-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner mode1 mode1 Sequential mode2 mode2 Sequential mode3 mode3 Sequential

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an imaging device, a method for driving any of them, and a method for fabricating any of them.

2. Description of the Related Art

A static random access memory (SRAM) is used as a cache of a processor or the like because data writing/reading can be performed at high speed.

Since an SRAM is a volatile memory, data is lost when power supply is stopped. Therefore, the following memory device structure is proposed: a transistor using an oxide semiconductor in a semiconductor layer in which a channel is formed (OS transistor) and a capacitor are added to an SRAM so that loss of data is prevented (see Patent Documents 1 to 3, for example).

REFERENCES

Patent Documents

[Patent Document 1] Japanese Published Patent Application No. 2013-9285
[Patent Document 2] Japanese Published Patent Application No. 2013-8437
[Patent Document 3] Japanese Published Patent Application No. 2013-8436

SUMMARY OF THE INVENTION

As described above, there are many structures as the structure of a semiconductor device functioning as a memory device. The structures have merits and demerits, and an appropriate structure is selected depending on circumstances. Therefore, a proposal of a semiconductor device having a novel structure can expand the range of choices for the structures.

An object of one embodiment of the present invention is to provide a novel semiconductor device or the like.

It is desired that the power consumption of a semiconductor device functioning as a memory device be further reduced.

An object of one embodiment of the present invention is to provide a semiconductor device or the like having a novel structure that achieves reduction in power consumption. An object of one embodiment of the present invention is to provide a semiconductor device or the like having a novel structure that can achieve fine-grained power gating.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device including a memory device including a memory cell array, a drive control circuit, a data control circuit, and first to fourth switches, and a power supply voltage control circuit. The memory cell array includes a memory cell. The memory cell includes a first memory portion and a second memory portion. The drive control circuit reads data by precharging a bit line and an inverted bit line which are electrically connected to the first memory portion. The data control circuit stores and restores data between the first memory portion and the second memory portion by control of the power supply voltage control circuit. The power supply voltage control circuit can control on or off of the first to fourth switches. The first switch can bring the bit line and the inverted bit line into an electrically floating state by being turned off. The second switch can stop supply of a power supply voltage to the memory cell array by being turned off. The third switch can stop supply of a power supply voltage to the drive control circuit by being turned off. The fourth switch can stop supply of a power supply voltage to the data control circuit by being turned off. The power supply voltage control circuit can switch between a first state in which the first switch is off, a second state in which the first and second switches are off, and a third state in which the first to fourth switches are off.

In the semiconductor device of one embodiment of the present invention, it is preferable that the first memory portion include an SRAM, the second memory portion include a first transistor and a capacitor, the first transistor include an oxide semiconductor in a semiconductor layer, and the first transistor be turned on or off by the data control circuit.

In the semiconductor device of one embodiment of the present invention, it is preferable that the SRAM include a second transistor, and the second transistor include silicon in a semiconductor layer.

In the semiconductor device of one embodiment of the present invention, it is preferred that a channel region of the first transistor and a channel region of the second transistor overlap with each other.

In the semiconductor device of one embodiment of the present invention, it is preferable that a third power supply voltage is larger than a first power supply voltage or a second power supply voltage.

In the semiconductor device of one embodiment of the present invention, it is preferable that the data control circuit include a level shifter.

Note that other embodiments of the present invention will be described in the following embodiments with reference to the drawings.

According to one embodiment of the present invention, it is possible to provide a semiconductor device or the like having a novel structure.

According to another embodiment of the present invention, it is possible to provide a semiconductor device or the like having a novel structure that achieves reduction in power consumption. According to another embodiment of the present invention, it is possible to provide a semiconductor device or the like having a novel structure that can achieve fine-grained power gating.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the above effects and the other effects. Accordingly, one embodiment of the present invention does not have the above effects in some cases.

BRIEF DESCRIPTION OF THE DRAWINGS

FIG. 12A, FIG. 12B1, FIG. 12B2, FIG. 12B3, and FIG. 12B4 are a schematic diagram and layout diagrams for describing one embodiment of the present invention.

DETAILED DESCRIPTION OF THE INVENTION

Figure 1:
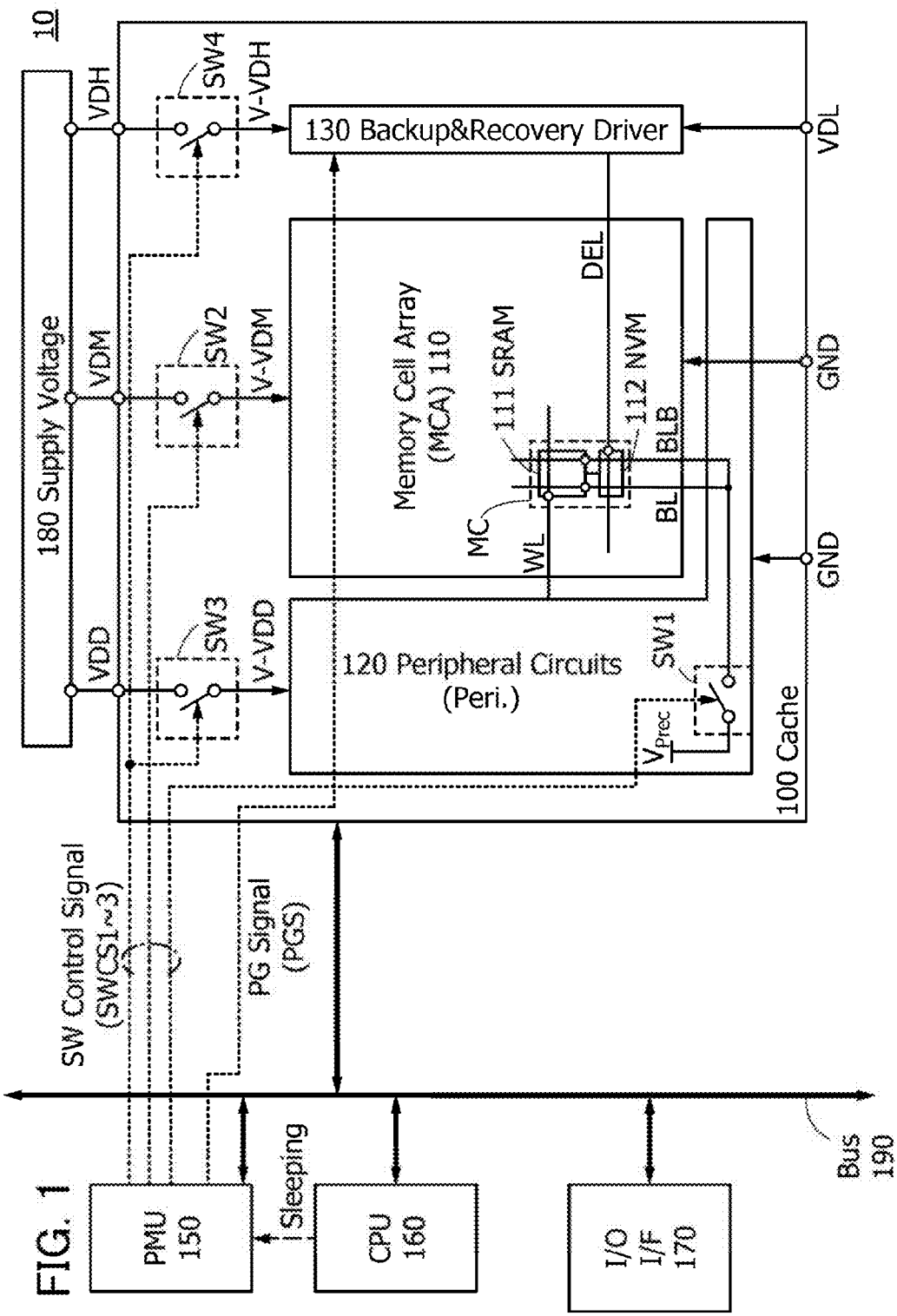
FIG. 1 is a block diagram for describing one embodiment of the present invention.

Hereinafter, embodiments will be described with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In this specification and the like, ordinal numbers such as first, second, and third are used in order to avoid confusion among components. Thus, the terms do not limit the number or order of components. In this specification and the like, a "first" component in one embodiment can be referred to as a "second" component in other embodiments or claims. Furthermore, in the present specification and the like, a "first" component in one embodiment can be omitted in other embodiments or claims.

In the drawings, the same components, components having similar functions, components formed of the same material, or components formed at the same time are denoted by the same reference numerals in some cases, and description thereof is not repeated in some cases.

Embodiment 1

In this embodiment, a block diagram of a semiconductor device and operations of a variety of circuits in power gating (hereinafter abbreviated to PG) are described.

In this specification and the like, a semiconductor device generally means a device that can function by utilizing semiconductor characteristics. The term "semiconductor device" refers to a memory such as a cache formed using semiconductor elements, e.g., transistors, peripheral circuits for controlling the memory, a CPU which inputs/outputs a signal to/from the memory and the peripheral circuits, a power supply voltage supplying circuit, a power management unit, and the entire system including the circuits.

<Block Diagram of Semiconductor Device>

FIG. 1 is a block diagram illustrating an example of a configuration of a semiconductor device.

A semiconductor device 10 includes a cache 100 (denoted by Cache), a power management unit 150 (denoted by PMU), a CPU 160, an input/output interface 170 (denoted by I/O I/F), a power supply voltage supplying circuit 180 (denoted by Supply Voltage), and a bus 190 (denoted by Bus).

The power management unit 150 has a function of switching three states, i.e., first to third states.

The cache 100 can be in the first state (also referred to as "mode1") when a period during which there is no access to the cache 100 is longer than a period $T_1$, e.g., longer than 700 μs. In the first state, a bit line and an inverted bit line of a memory cell in the cache 100 are brought into an electrically floating state to reduce power consumption. By intermittently bringing the bit line and the inverted bit line into an electrically floating state, power consumption due to a leakage current from the bit line and the inverted bit line at a precharge potential to the memory cell can be reduced, so that lower power consumption can be achieved.

The cache 100 can be in the second state (also referred to as "mode2") when a period during which there is no access to the cache 100 is longer than a period $T_2(>T_1)$, e.g., longer than 1.6 ms. In the second state, the supply of a power supply voltage to a memory cell array in the cache 100 is stopped, i.e., power gating is performed. By intermittently stopping the supply of the power supply voltage to the memory cell array, lower power consumption can be achieved.

The cache 100 can be in the third state (also referred to as "mode3") when a period during which there is no access to the cache 100 is longer than a period $T_3(>T_2)$, e.g., longer than 60 ms. In the third state, the supply of the power supply voltage to the memory cell array in the cache 100 is stopped, and the supply of a power supply voltage to peripheral circuits and a backup/recovery driver circuit is also stopped. By intermittently stopping the supply of the power supply voltage to the memory cell array, the peripheral circuits, and the backup/recovery driver circuit, lower power consumption can be achieved.

The power management unit 150 can switch the first to third states by supplying first to third switch control signals (SW Control Signal: SWCS1 to SWCS3) and a power gating signal (PG Signal: PGS) to the cache 100 or the power supply voltage supplying circuit 180.

The power management unit 150 can switch the first to third states in accordance with a sleeping signal (denoted by Sleeping) from the CPU 160, a signal from external hardware through the input/output interface 170, or a state of the bus 190.

Note that the power management unit 150 is a circuit having a function of outputting the first to third switch control signals and the power gating signal and is simply referred to as a circuit in some cases.

The power management unit 150 can switch the first to third states in accordance with the length of a period during which there is no access to the cache 100. Break-even time (BET) varies depending on the states of the cache 100. For example, in the case where a non-access period is longer than the period $T_1$, bringing the bit line into an electrically floating state is more effective in reducing power consumption than power gating. In the case where a non-access period is longer than the period $T_2$, power gating of the memory cell array is more effective in reducing power consumption than bringing the bit line into an electrically floating state. In the case where a non-access period is longer than the period $T_3$, power gating of the memory cell array and the peripheral circuits is more effective in reducing power consumption than power gating of the memory cell array.

In one embodiment of the present invention, the circuits included in the semiconductor device are divided into parts, and the first to third states are transferred to a state most suitable for reduction in power consumption depending on conditions. Consequently, fine-grained power gating can be achieved, so that reduction in power consumption of the semiconductor device can be achieved.

<Components of Cache 100>

Components of the cache 100 will be described.

The cache 100 includes a memory cell array 110 (denoted by MCA), peripheral circuits 120 (denoted by Peripheral Circuits), and a backup/recovery driver circuit 130 (denoted by Backup & Recovery Driver). The peripheral circuits 120 include a switch SW1. The cache 100 includes switches SW2 to SW4.

The cache 100 is a device having a function of temporarily storing an instruction used in the CPU 160 or data such as arithmetic results, and is also referred to as a memory device.

The memory cell array 110 includes a plurality of memory cells MC. The memory cell MC is a circuit based on an SRAM, and includes an SRAM 111 and a nonvolatile memory portion 112 (denoted by NVM).

Data writing/reading of the SRAM 111 are controlled by a word line WL, a bit line BL, and an inverted bit line BLB. The SRAM 111 can perform data writing/reading at high speed like a general SRAM. Data in the SRAM 111 is lost when a power supply voltage is not supplied. The SRAM 111 is also referred to as a volatile memory portion or a first memory portion.

In the nonvolatile memory portion 112, backup and recovery of data stored in the SRAM 111 are controlled by a data control line DEL. The nonvolatile memory portion 112 is a circuit having a function of backing up (also referred to as storing) data stored in the SRAM 111. Furthermore, the nonvolatile memory portion 112 is a circuit having a function of recovering (also referred to as restoring) data backed up. The nonvolatile memory portion 112 is also referred to as a nonvolatile memory circuit or a second memory portion.

The memory cell MC including the SRAM 111 and the nonvolatile memory portion 112 can store data even when a power supply voltage is not supplied, only by backing up data stored in the SRAM 111 to the nonvolatile memory portion 112. the data stored in the nonvolatile memory portion 112 can be restored to the previous state only by recovering the data to the SRAM 111.

The backup and recovery operation can be achieved by turning on or off a transistor in the nonvolatile memory portion 112. The transistor allows the SRAM 111 and the nonvolatile memory portion 112 to have the same potential to transfer charges, whereby data backup and recovery are performed.

The peripheral circuits 120 are connected to the word line WL, the bit line BL, and the inverted bit line BLB. The peripheral circuits 120 have a function of supplying a signal for writing data to the SRAM 111 or a signal for reading data from the SRAM 111. The peripheral circuits 120 are circuits including, for example, a decoder and a precharge circuit.

The switch SW1 included in the peripheral circuits 120 has a function of controlling whether is supply a precharge voltage $V_{Prec}$ to the bit line BL and the inverted bit line BLB. The precharge voltage $V_{Prec}$ can be supplied to the bit line BL and the inverted bit line BLB by turning on the switch SW1. The bit line BL and the inverted bit line BLB can be brought into an electrically floating state by turning off the switch SW1. Data of the SRAM 111 can be read by supplying the precharge voltage $V_{Prec}$ to the bit line BL and the inverted bit line BLB.

Control of on/off states of the switch SW1 is performed using the first switch control signal. The first switch control signal is supplied from the power management unit 150. Note that the switch SW1 can be formed using a p-channel transistor, for example. The switch SW1 may be formed using an n-channel transistor.

In the first state, the switch SW1 is turned off using the first switch control signal. By turning off the switch SW1, the bit line BL and the inverted bit line BLB can be intermittently brought into an electrically floating state. Thus, power consumption can be reduced as compared to the case where the precharge voltage $V_{Prec}$ is supplied to the bit line BL and the inverted bit line BLB continuously and steadily. Since the load on the bit line BL and the inverted bit line BLB is not so large, the cache 100 can return to the previous state, i.e., a state in which the precharge voltage $V_{Prec}$ is supplied to the bit line BL and the inverted bit line BLB only by turning on the switch SW1. Therefore, the operation for the first state can contribute to a reduction in power consumption of the semiconductor device even in the case where a non-access period to the cache 100 is longer than the period $T_1$, e.g., longer than 700 μs.

Note that a non-access period to the cache 100 for the transition to the first state is a period longer than the period $T_1$. In other words, when a period during which there is no access to the cache 100 is longer than 700 μs and shorter than or equal to 1.6 ms, the first state is provided.

The backup/recovery driver circuit 130 is connected to the data control line DEL. The backup/recovery driver circuit 130 has a function of supplying a signal for data backup and recovery between the SRAM 111 and the nonvolatile memory portion 112. The backup/recovery driver circuit 130 is a circuit including, for example, a buffer and a level shifter.

The cache 100 is supplied with power supply voltages externally. The power supply voltages are supplied as, for example, the following three voltages: VDD/GND, VDM/GND, and VDH/VDL.

VDD/GND is a power supply voltage supplied to the peripheral circuits 120. Supply of VDD/GND to the peripheral circuits 120 is controlled by the switch SW3. The switch SW3 can switch whether VDD is supplied to a power supply potential line V-VDD connected to the peripheral circuits 120.

VDM/GND is a power supply voltage supplied to the memory cell array 110. Supply of VDM/GND to the memory cell array 110 is controlled by the switch SW2. The switch SW2 can switch whether VDM is supplied to a power supply potential line V-VDM connected to the memory cell array 110. Note that the potential VDM may be a potential VDD.

VDH/VDL is a power supply voltage supplied to the backup/recovery driver circuit 130. Supply of VDH/VDL to the backup/recovery driver circuit 130 is controlled by the switch SW4. The switch SW4 can switch whether VDH is supplied to a power supply potential line V-VDH connected to the backup/recovery driver circuit 130.

It is preferable that the potential VDH be higher than the potential VDM and the potential VDD and that the potential VDL be lower than the potential GND. Thus, the amplitude of a voltage to be applied to the data control line DEL can be increased. This can achieve the data backup and recovery more reliably when the data backup and recovery are performed by turning on or off the transistor.

Control of on/off states of the switch SW2 is performed using the second switch control signal. The second switch control signal is supplied from the power management unit 150. Note that like the switch SW1, the switch SW2 can be formed using a p-channel transistor, for example.

In the second state, the switch SW2 is turned off using the second switch control signal. The memory cell array 110 can be intermittently subjected to power gating by turning off the switch SW2. Thus, power consumption can be reduced as compared to the case where the VDM/GND is supplied as a power supply voltage to the memory cell array 110 continuously and steadily. After data backup is performed, the data can be held in the memory cell array 110 even when the switch SW2 is turned off. When the switch SW2 is turned on again and data recovery is performed, the memory cell can return to the previous state. If the transition to the second state is performed in a non-access period as extremely short as approximately 700 μs, power consumption of the data backup and recovery is relatively high. In contrast, when the transition to the second state is performed in a non-access period longer than the period $T_2$, e.g., longer than 1.6 ms, the period exceeds the break-even time; thus, the second state can contribute to a reduction in power consumption of the semiconductor device.

The SRAM 111 included in the memory cell MC consumes a large amount of power in an idling period. Therefore, the break-even time of power gating of the memory cell array 110 is short. Thus, power gating for a period of several milliseconds allows the reduction of power consumption.

Note that a non-access period to the cache 100 for the transition to the second state is a period longer than 1.6 ms. In other words, when a period during which there is no access to the cache 100 is longer than 1.6 ms and shorter than or equal to 60 ms, the second state is provided.

Control of on/off states of the switches SW3 and SW4 is performed using the third switch control signal. The third switch control signal is supplied from the power management unit 150. Note that like the switches SW1 and SW2, the switches SW3 and SW4 can be formed using p-channel transistors, for example.

In the third state, the switch SW3 and the switch SW4 are turned off using the third switch control signal. The peripheral circuits 120 and the backup/recovery driver circuit 130 can be intermittently subjected to power gating by turning off the switches SW3 and SW4. Thus, power consumption can be reduced as compared to the case where the VDD/GND and the VDH/VDL are supplied as power supply voltages continuously and steadily. The supply of the power supply voltage to the peripheral circuits 120 and the backup/recovery driver circuit 130 may be stopped in the case where writing and reading of data are not performed or the case where backup and recovery are already performed. If the transition to the third state is performed in a non-access period shorter than or equal to 60 ms, e.g., a non-access period of 700 μs or 1.6 ms, power consumption of charging and discharging of the wiring is relatively high. In contrast, when the transition to the third state is performed in a non-access period longer than the period $T_3$, e.g., longer than 60 ms, the period exceeds the break-even time; thus, the third state can contribute to a reduction in power consumption of the semiconductor device.

The BET in the case where power gating is performed in the peripheral circuits 120 and the backup/recovery driver circuit 130 in addition to the memory cell array 110 is longer than the BET in the case where power gating is performed only in the memory cell array 110. The semiconductor device can switch power gating in the first state where the BET is short and power gating in the second state where the BET is long depending on the non-access period to the cache 100.

Note that a non-access period to the cache 100 for the transition to the third state is a period longer than 60 ms. Note that the following configuration may be employed: when the non-access period exceeds 10 s, the upper limit, the non-access to the cache 100 is assumed to continue, and the supply of the power supply voltage to the power supply voltage supplying circuit 180 for supplying a voltage to the semiconductor device is stopped to perform power gating on the semiconductor device.

According to one embodiment of the present invention, reduction in power consumption can be achieved. According to one embodiment of the present invention, fine-grained power gating can be achieved.

<Transition Between States in Power Gating>

Transition between the first state, the second state, and the third state is described with reference to FIG. 2. In FIGS. 3A and 3B, FIGS. 4A and 4B, and FIGS. 5A and 5B, the state of the cache 100 in the first to third states and a sequence of rising of the first to third switch control signals (SWCS1 to SWCS3) and the power gating signal (PGS) in data backup and recovery are described.

Figure 2:
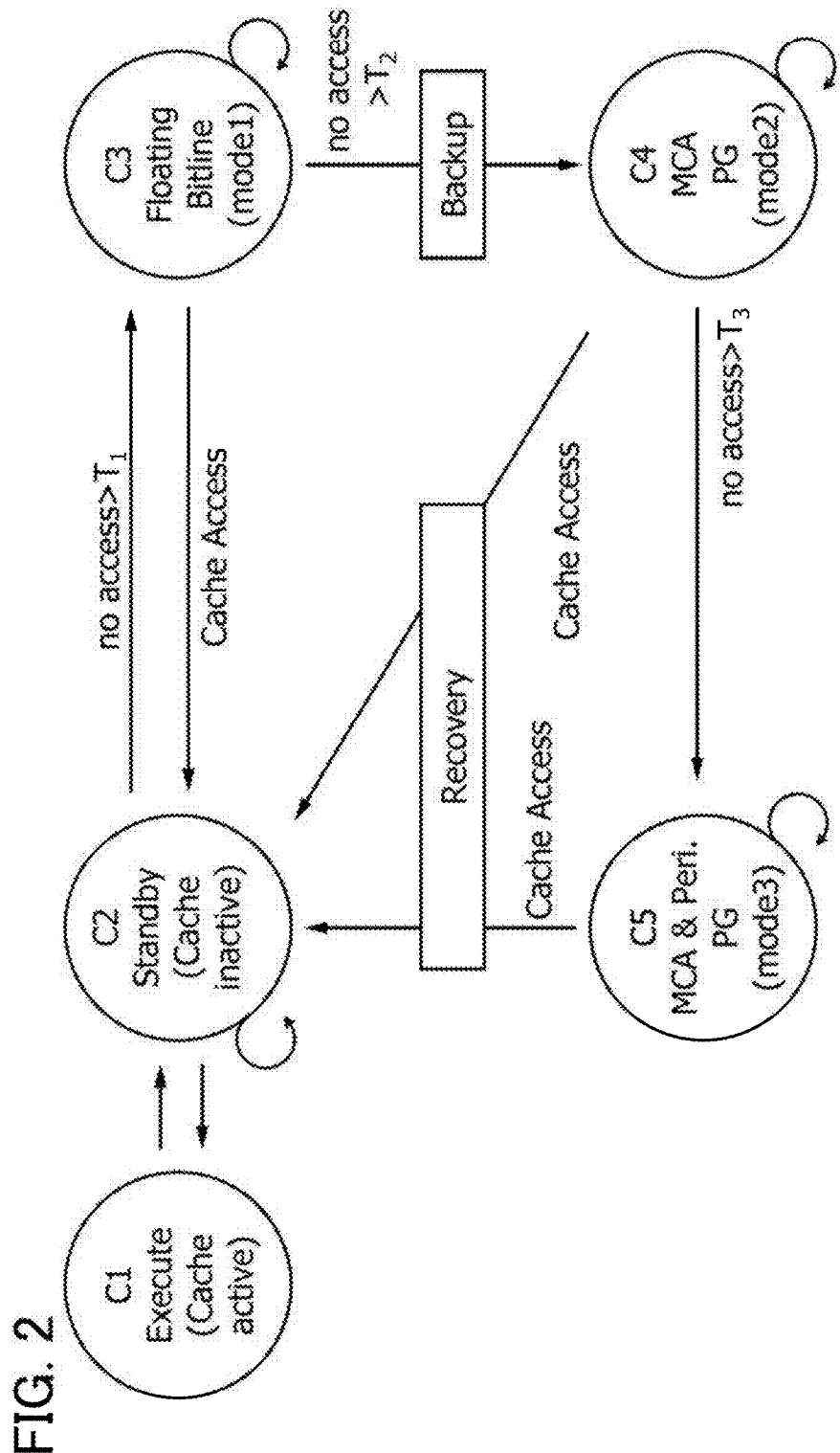
FIG. 2 is a state transition diagram for describing one embodiment of the present invention.

As possible states of the cache 100, FIG. 2 shows the following: a normal operation state (denoted by Execute), which is referred to as C1; a standby state (denoted by Standby), which is referred to as C2; the first state (denoted by Floating Bitline (mode1)), which is referred to as C3; the second state (denoted by MCA PG (mode2)), which is referred to as C4; and the third state (denoted by MCA & Peri. PG (mode3)), which is referred to as C5.

The normal operation C1 is a state where data writing/reading is performed in the cache 100.

The standby state C2 is a state where data writing/reading is not performed in the cache 100.

In the case where there is access from the CPU 160 to the cache 100 regularly, the normal operation C1 and the standby state C2 are repeated.

In the case where the standby state C2 is continued and there is no access to the cache 100 during a period longer than the period $T_1$, e.g., longer than 700 µs, transition to the first state C3 is performed. By the transition from the standby state C2 to the first state C3, the bit line BL and the inverted bit line BLB are brought into an electrically floating state. In the state, the switch SW1 between a wiring for supplying the precharge voltage $V_{Prec}$ and the bit line BL and the inverted bit line BLB are off.

Note that in the case where there is access to the cache 100 again, the cache 100 returns to the previous state, i.e., the standby state C2, by turning on the switch SW1. The transition from the first state C3 to the standby state C2 can be performed in a remarkably short time because only time to charge the bit line BL and the inverted bit line BLB is required.

Figure 3A:
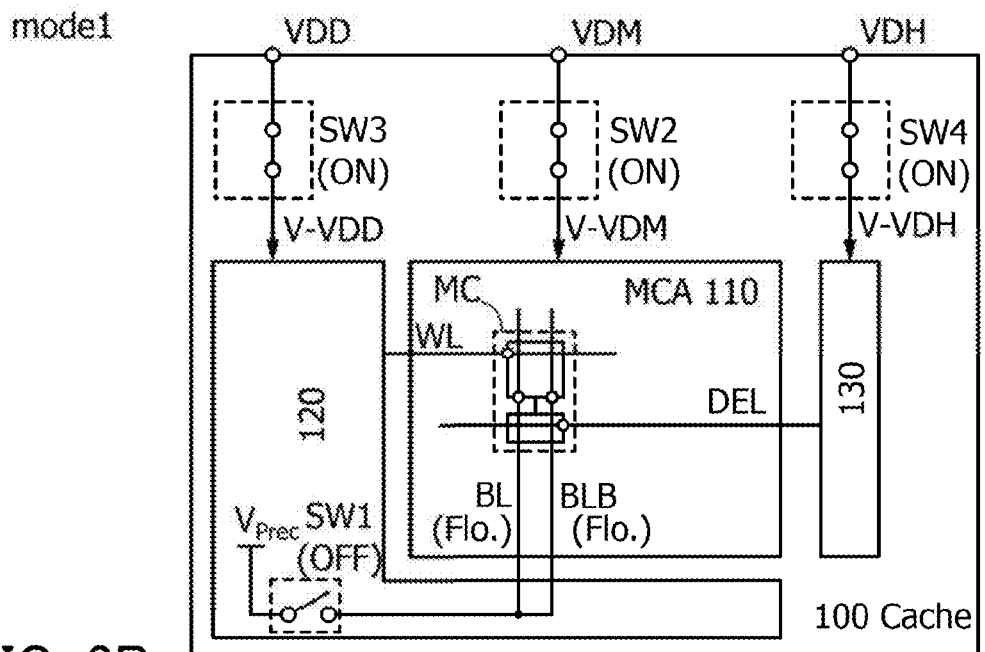
FIGS. 3A and 3B are a block diagram and a timing chart for describing one embodiment of the present invention.

Note that in the first state C3, as shown in FIG. 3A, the switch SW1 is off and the switches SW2, SW3, and SW4 are on so that the bit line BL and the inverted bit line BLB are brought into an electrically floating state.

Figure 3B:
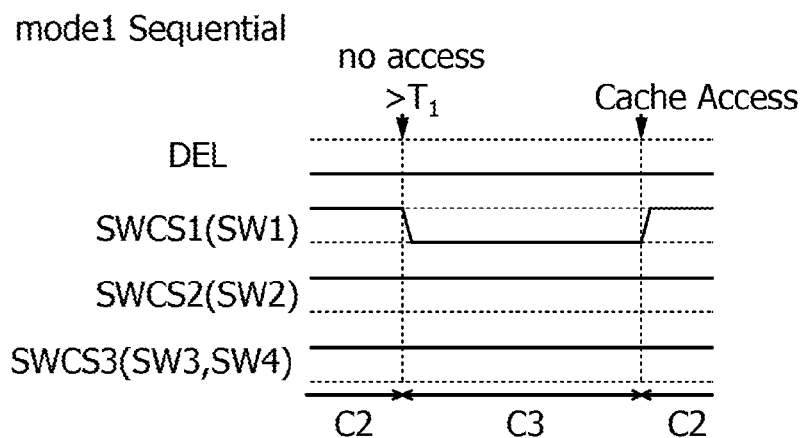

The transition from the standby state C2 to the first state C3 is performed by controlling the first to third switch control signals and the potential of the data control line DEL according to a timing chart in FIG. 3B.

When the potential of the data control line DEL is at H level, backup or recovery is performed, and when the potential of the data control line DEL is at L level, data holding is performed. Note that the potential of the data control line DEL is obtained by raising (or lowering) the voltage VDD/GND of the power gating signal to a voltage of VDH/VDL in the backup/recovery driver circuit 130. Therefore, a change in the potential of the data control line DEL is used to describe a change in the power gating signal.

When the first to third switch control signals are at H level, the switches are turned on, and when the first to third switch control signals are at L level, the switches are turned off.

In the timing chart shown in FIG. 3B, the potential of the data control line DEL is at L level. The potentials of the second and third switch control signals are at H level. When there is no access to the cache 100 during a period longer than the period $T_1$ (longer than 700 µs here), the potential of the first switch control signal is changed from H level to L level. Thus, the switch SW1 is turned off to bring the bit line BL and the inverted bit line BLB into an electrically floating state. When there is access to the cache 100, the switch SW1 is turned on by changing the potential of the first switch control signal from L level to H level to set the bit line BL and the inverted bit line BLB to the precharge voltage $V_{Prec}$.

In the case where the first state C3 is continued and there is no access to the cache 100 during a period longer than the period $T_2$, e.g., longer than 1.6 ms, transition to the second state C4 is performed. By the transition from the first state C3 to the second state C4, the cache 100 is brought into a state in which the supply of the power supply voltage is stopped by performing power gating of the memory cell array 110 after data of the SRAM 111 is backed up in the nonvolatile memory portion 112. In the state, the switch SW2 between a wiring for supplying the potential VDM and the memory cell array 110 is off.

Note that when there is access to the cache 100 again, the data of the nonvolatile memory portion 112 is recovered to the SRAM 111, and then, the switch SW2 is turned on and the switch SW1 is turned on. Thus, the cache 100 returns to the previous state, i.e., the standby state C2. The transition from the second state C4 to the standby state C2 takes longer time than the time for the transition from the first state C3 to the standby state C2. This is because time for the transition from the second state C4 to the standby state C2 includes time to restart the supply of the power supply voltage to the SRAM 111, for example, in addition to the time to charge the bit line BL and the inverted bit line BLB.

Figure 4A:
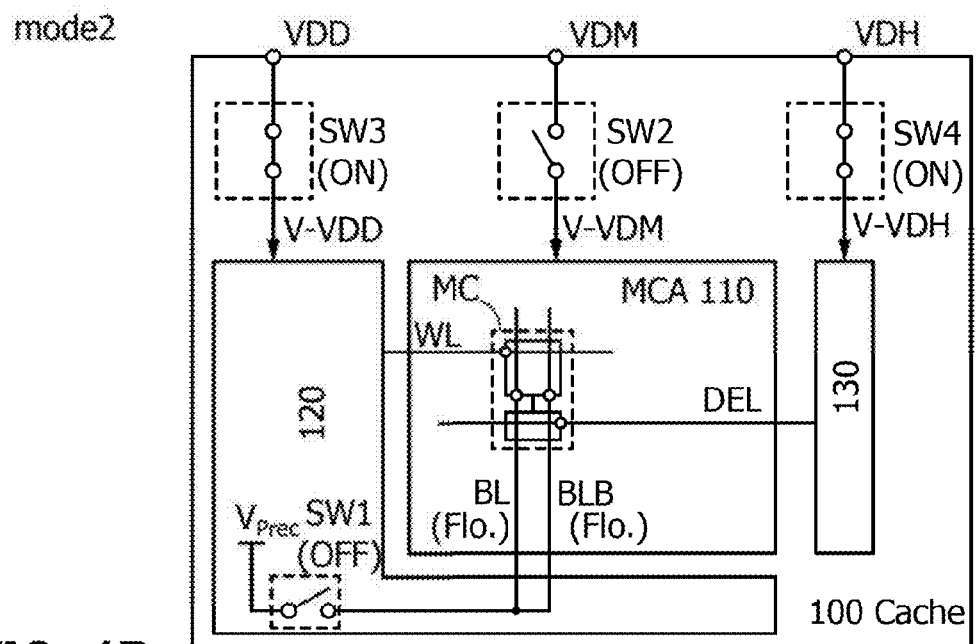
FIGS. 4A and 4B are a block diagram and a timing chart for describing one embodiment of the present invention.

Note that in the second state C4, as shown in FIG. 4A, the switches SW1 and SW2 are off and the switches SW3 and SW4 are on; thus, the bit line BL and the inverted bit line BLB are brought into an electrically floating state and the supply of the power supply voltage to the memory cell array 110 is stopped.

Figure 4B:
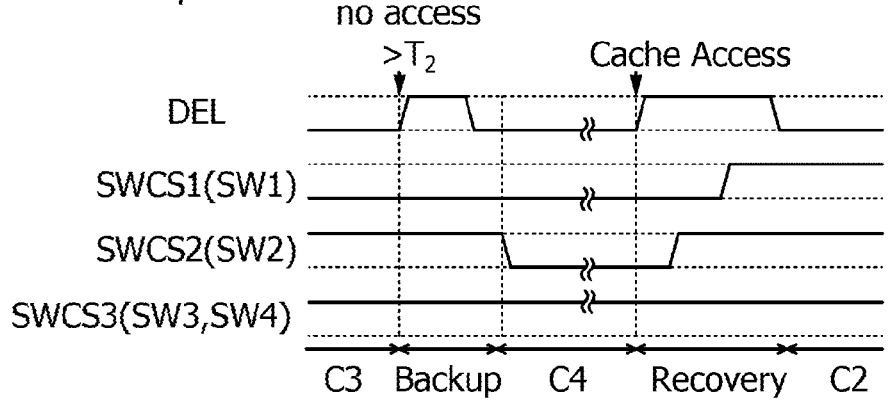

The transition from the first state C3 to the second state C4 is performed by controlling the first to third switch control signals and the potential of the data control line DEL according to a timing chart in FIG. 4B.

In the timing chart shown in FIG. 4B, the potential of the first switch control signal is at L level, and the potential of the third switch control signal is at H level. When there is no access to the cache 100 during a period longer than the period $T_2$ (longer than 1.6 ms here), the potential of the data control line DEL is changed from L level to H level, and data of the SRAM 111 is backed up in the nonvolatile memory portion 112. After the data is backed up in the nonvolatile memory portion 112, the potential of the data control line DEL is changed from H level to L level so that the backup data is held. Then, the switch SW2 is turned off by changing the potential of the second switch control signal from H level to L level to stop the supply of the power supply voltage to the memory cell array 110.

When there is access to the cache 100, the potential of the data control line DEL is changed from L level to H level, and the data of the nonvolatile memory portion 112 is recovered to the SRAM 111. After the data is recovered to the SRAM 111, the switch SW2 is turned on by changing the potential of the second switch control signal from L level to H level to restart the supply of the power supply voltage to the memory cell array 110. Then, the switch SW1 is turned on by changing the potential of the first switch control signal from L level to H level to supply the precharge voltage $V_{Prec}$ to the bit line BL and the inverted bit line BLB.

In the case where the second state C4 is continued and there is no access to the cache 100 during a period longer than the period $T_3$, e.g., longer than 60 ms, transition to the third state C5 is performed. By the transition from the second state C4 to the third state C5, the cache 100 is brought into a state in which the supply of the power supply voltage is stopped by performing power gating of the peripheral circuits 120 and the backup/recovery driver circuit 130. In the state, the switch SW3 between a wiring for supplying the potential VDD and the peripheral circuits 120 and the switch SW4 between a wiring for supplying the potential VDH and the backup/recovery driver circuit 130 are off.

Note that when there is access to the cache 100 again, after the switches SW3 and SW4 are turned on to restart the supply of the power supply voltage to the peripheral circuits 120 and the backup/recovery driver circuit 130, the data of the nonvolatile memory portion 112 is recovered to the SRAM 111. After that, the switch SW2 is turned on, and then, the switch SW1 is turned on. Thus, the cache 100 returns to the previous state, i.e., the standby state C2. The transition from the third state C5 to the standby state C2 takes longer time than the time for the transition from the second state C4 to the standby state C2. This is because time for the transition from the third state C5 to the standby state C2 includes time to charge a wiring in the peripheral circuits 120 and the backup/recovery driver circuit 130, for example, in addition to the time to charge the bit line BL and the inverted bit line BLB and the time to restart the supply of the power supply voltage to the SRAM 111.

Figure 5A:
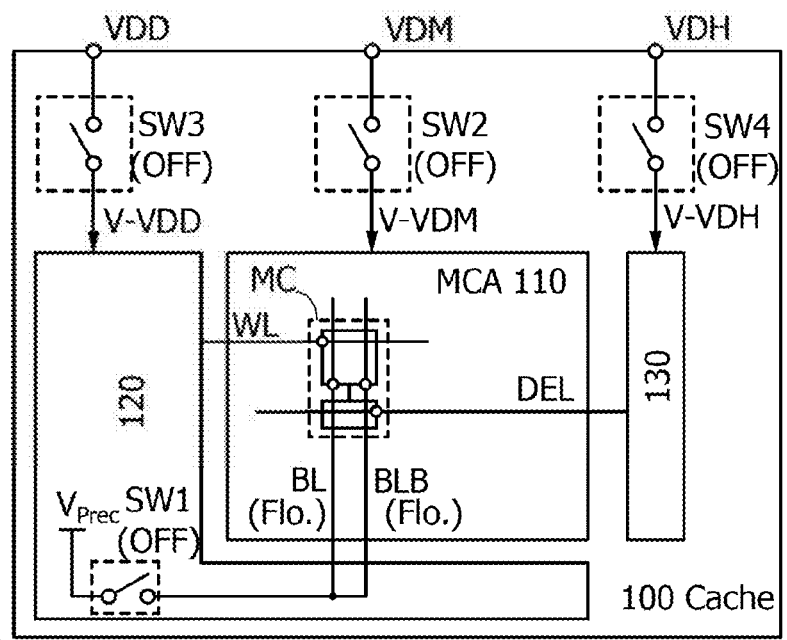
FIGS. 5A and 5B are a block diagram and a timing chart for describing one embodiment of the present invention.

Note that in the third state C5, as shown in FIG. 5A, the switches SW1, SW3, and SW4 are off; thus, the bit line BL and the inverted bit line BLB are brought into an electrically floating state, and the supply of the power supply voltages to the memory cell array 110, the peripheral circuits 120, and the backup/recovery driver circuit 130 is stopped.

Figure 5B:
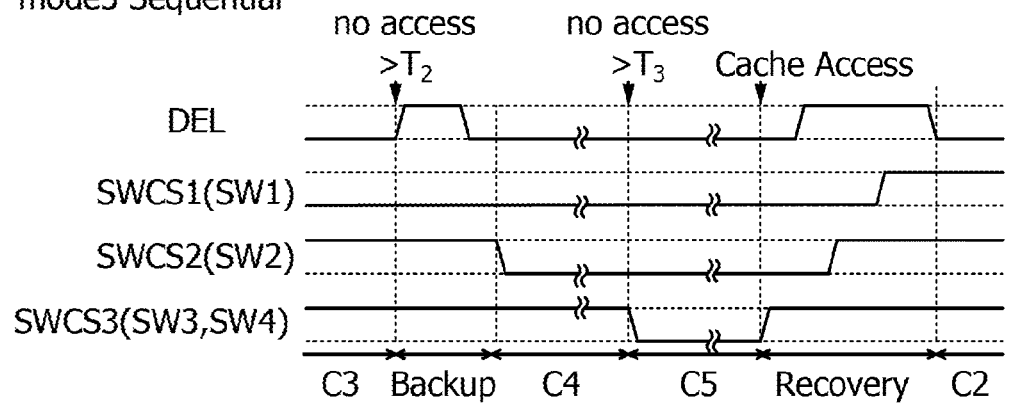

The transition from the second state C4 to the third state C5 is performed by controlling the first to third switch control signals and the potential of the data control line DEL according to a timing chart in FIG. 5B.

In the timing chart shown in FIG. 5B, operations up to and including the data backup and the transition to the second state C4 are performed in a manner similar to that in the description of FIG. 4B. In the second state C4, the potential of the data control line DEL is at L level, the potential of the first switch control signal is at L level, the potential of the second switch control signal is at L level, and the potential of the third switch control signal is at H level. When there is no access to the cache 100 during a period longer than the period $T_3$ (longer than 60 ms here), the switches SW3 and SW4 are turned off by changing the potential of the third switch control signal from H level to L level to stop the supply of the power supply voltage to the peripheral circuits 120 and the backup/recovery driver circuit 130.

When there is access to the cache 100, the potentials of the third switch control signal and the fourth switch control signal are changed from L level to H level to restart the supply of the power supply voltage to the peripheral circuits 120 and the backup/recovery driver circuit 130. Then, the potential of the data control line DEL is changed from L level to H level, and the data of the nonvolatile memory portion 112 is recovered to the SRAM 111. After the data is recovered to the SRAM 111, the switch SW2 is turned on by changing the potential of the second switch control signal from L level to H level to restart the supply of the power supply voltage to the memory cell array 110. Then, the switch SW1 is turned on by changing the potential of the first switch control signal from L level to H level to set the bit line BL and the inverted bit line BLB to the precharge voltage $V_{Prec}$.

In the above-described semiconductor device of one embodiment of the present invention, the cache 100 is brought into any of the above states depending on the length of the non-access period to the cache 100. Specifically, with the use of the first to third switch control signals and the power gating signal, the data backup and recovery are performed, and furthermore, the bit line and the inverted bit line are brought into an electrically floating state and the supply of the power supply voltage to the circuit in the cache 100 is stopped or restarted in stages. According to one embodiment of the present invention, reduction in power consumption can be achieved.

Embodiment 2

In this embodiment, a specific configuration of the block diagram in FIG. 1 is described. In this embodiment, a specific example of a memory cell is described. In this embodiment, a specific example of a precharge circuit is described.

<Specific Example of Block Diagram of Semiconductor Device>

Figure 6:
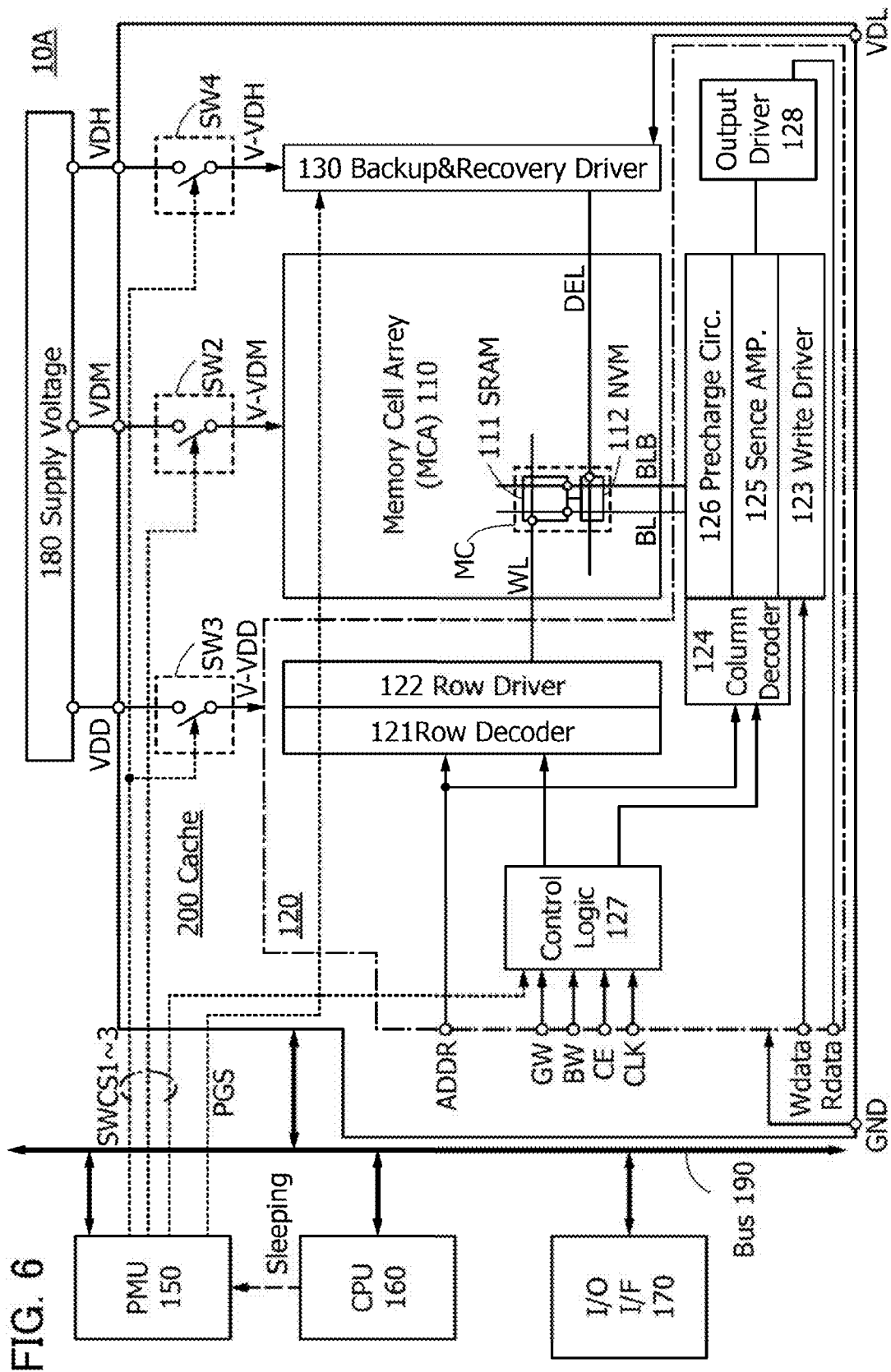
FIG. 6 is a block diagram for describing one embodiment of the present invention.

FIG. 6 is a block diagram illustrating a specific example of the configuration of the semiconductor device 10 in FIG. 1. Note that in this embodiment, description which overlaps with the description in Embodiment 1 is omitted and the above description is referred to.

A semiconductor device 10A includes a cache 200, the power management unit 150, the CPU 160, the input/output interface 170, the power supply voltage supplying circuit 180, and the bus 190.

The cache 200 includes the memory cell array 110, the peripheral circuits 120, the backup/recovery driver circuit 130, and the switches SW2 to SW4.

The peripheral circuits 120 include a row decoder 121, a row driver 122, a write driver 123, a column decoder 124, a sense amplifier 125, a precharge circuit 126, a driver control logic circuit 127, and an output driver 128.

An address signal ADDR and a control signal output from the driver control logic circuit 127 are supplied to the row decoder 121 and the row driver 122. The row decoder 121 and the row driver 122 are a circuit having a function of generating a signal supplied to the word line WL, for example, a word signal. By control of the switch SW3, power gating of the row decoder 121 and the row driver 122 is performed, i.e., restart and stop of the function are controlled. When the function is stopped, the row driver 122 is preferably held in a state where the word line WL is kept at a low power supply potential.

An address signal ADDR and a control signal output from the driver control logic circuit 127 are supplied to the write driver 123 and the column decoder 124. The write driver 123 is a circuit having a function of supplying input write data Wdata to the bit line BL and the inverted bit line BLB that are selected by the column decoder 124.

The sense amplifier 125 is a circuit having a function of sensing change in the potentials of the bit line BL and the inverted bit line BLB that are selected by the column decoder 124 to read stored data.

The precharge circuit 126 is a circuit having a function of precharging the bit line BL and the inverted bit line BLB and setting the bit line BL and the inverted bit line BLB at the same potential. Note that the precharge circuit 126 is a circuit including the switch SW1 described in Embodiment 1 and having a function of supplying the precharge voltage $V_{Prec}$ and bringing the bit line BL and the inverted bit line BLB into an electrically floating state. A configuration example of the precharge circuit 126 will be described later in detail.

The driver control logic circuit 127 is a circuit having a function of generating signals for controlling the row decoder 121, the row driver 122, the write driver 123, the column decoder 124, the sense amplifier 125, and the precharge circuit 126 in accordance with a global write signal (GW), a byte write signal (BW), a chip enable signal (CE), a clock signal (CLK), and the first switch control signal (SWCS1) which are input. By control of the switch SW2, power gating of the driver control logic circuit 127 is performed and restart and stop of the function is controlled.

The output driver 128 is a circuit having a function of generating read data Rdata in accordance with data obtained in the sense amplifier 125 and outputting the read data Rdata to the outside.

After power gating of the memory cell array 110 is performed, the functions of the circuits included in the peripheral circuits 120 are stopped after the operation is stopped. The stop of the functions is performed by controlling the third switch control signal so that the switch SW2 is off. The restart of the functions is performed by turning on the switch SW2, and the timing of turning on the switch SW2 is preferably earlier than the timing of turning on the switch SW1.

<Specific Example of Memory Cell>

Next, a specific example of the memory cell in FIG. 1 is described.

Figure 7A:
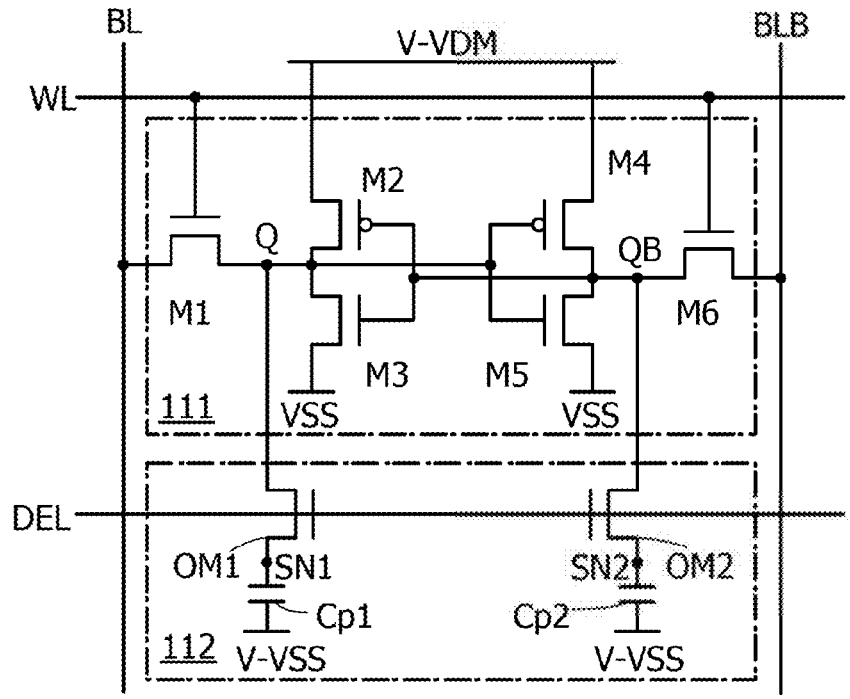
FIGS. 7A and 7B are a circuit diagram and a timing chart for describing one embodiment of the present invention.

A memory cell MC illustrated in FIG. 7A includes the SRAM 111 and the nonvolatile memory portion 112. The SRAM 111 includes transistors M1 to M6. The nonvolatile memory portion 112 includes transistors OM1 and OM2 and capacitors Cp1 and Cp2.

In FIG. 7A, a node between the transistor M1 and the transistor OM1 is referred to as a node Q. A node between the transistor M6 and the transistor OM2 is referred to as a node QB. A node between the transistor OM1 and the capacitor Cp1 is referred to as a node SN1. A node between the transistor OM2 and the capacitor Cp2 is referred to as a node SN2.

In the memory cell MC shown in FIG. 7A, a word line WL, a bit line BL, an inverted bit line BLB, a data control line DEL, a power supply potential line V-VDM, and a power supply potential line V-VSS are shown. Note that the power supply potential line V-VSS is set at GND, and GND is also referred to as L level.

The transistors M1 to M6 included in the SRAM 111 are transistors including a semiconductor such as silicon (Si transistors) in a semiconductor layer. The transistors OM1 and OM2 included in the nonvolatile memory portion 112 are transistors having lower off-state currents than Si transistors.

An example of a transistor having a lower off-state current than a Si transistor includes a transistor including an oxide semiconductor in a semiconductor layer (OS transistor). The off-state current of an OS transistor can be extremely low by reducing the concentration of impurities in an oxide semiconductor to make the oxide semiconductor intrinsic or substantially intrinsic. An OS transistor will be described in detail in Embodiment 3.

In the memory cell MC in FIG. 7A, when the transistors OM1 and OM2 are turned on, the potentials of the nodes Q and QB can be supplied to the nodes SN1 and SN2, respectively. When the transistors OM1 and OM2 are turned off, charge corresponding to the potentials can be constantly held at the nodes SN1 and SN2 which are in an electrically floating state. Since the charge can be constantly held even after supply of the power supply voltage is stopped, the nonvolatile memory portion 112 included in the memory cell MC can be nonvolatile.

Note that in a period for retaining a potential, a predetermined voltage is continuously supplied to the transistors OM1 and OM2 in some cases. For example, a voltage that completely turns off the transistors OM1 and OM2 might keep being supplied to gates of the transistors OM1 and OM2. Alternatively, a voltage that shifts the threshold voltages to allow the transistors OM1 and OM2 exist in a normally-off state may keep being supplied to back gates of the transistors OM1 and OM2. In these cases, a voltage is supplied to the memory cell MC in the period for retaining data; however, little power is consumed because almost no current flows. Because of little power consumption, the memory cell MC can be regarded as being substantially nonvolatile even if a predetermined voltage is supplied to the memory cell MC.

The following explanation is provided for the cases where the OS transistor is an n-channel transistor unless otherwise specified. Therefore, in each of the transistors OM1 and OM2, when a signal supplied to a gate is at H level, a source and a drain are electrically conductive therebetween, and when a signal supplied to the gate is at L level, the source and the drain are not electrically conductive therebetween.

Figure 7B:
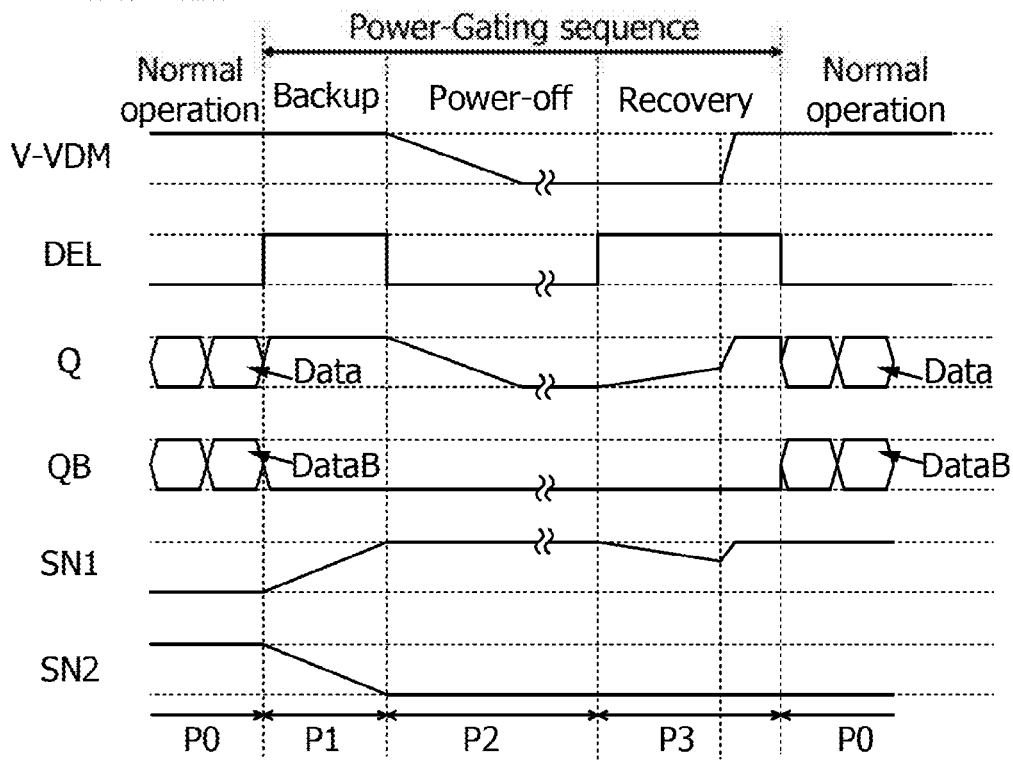

Next, operation shown in the circuit diagram in FIG. 7A is described using a timing chart in FIG. 7B. In FIG. 7B, a power-gating sequence (PG sequence) of backup (Backup), stop of supply of a power supply voltage (Power-off), and recovery (Recovery) is described.

According to the timing chart in FIG. 7B, data Data and data DataB are first held at the nodes Q and QB in normal operation (Normal operation), respectively. Note that in FIG. 7B, the data Data is at an H-level potential and the data DataB is at an L-level potential.

In backup, first, the data control line DEL is set to H level so that the transistors OM1 and OM2 are turned on. The nodes SN1 and SN2 are set to the same potential as the nodes Q and QB, respectively, so that backup to the nodes SN1 and SN2 is performed. In FIG. 7B, an H-level potential is held at the node SN1 and an L-level potential is held at the node SN2.

After the backup operation is finished, supply of the power supply voltages is stopped. In other words, the potential of the power supply potential line V-VDM is set to a potential equal to the potential of the power supply potential line V-VSS, i.e., an L-level potential. As the potential of the power supply potential line V-VDM decreases, the potentials of the nodes Q and QB also decrease. In contrast, when the data control line DEL is set to L level, the potentials of the nodes SN1 and SN2 are held.

In recovery, first, the data control line DEL is set to H level so that the transistors OM1 and OM2 are turned on. Then, the nodes Q and SN1 have the same potential, and the nodes QB and SN2 have the same potential. Consequently, a potential difference between the node Q and the node QB is generated. In the state where the potential difference is generated, the potential of the power supply potential line V-VDM is set to H level. Then, the potentials of the nodes Q and QB are returned to those in normal operation.

Through the above PG sequence, normal operation can be restarted.

<Specific Examples of Precharge Circuit>

Specific examples of the precharge circuit 126 shown in FIG. 6 are described.

Figure 8:
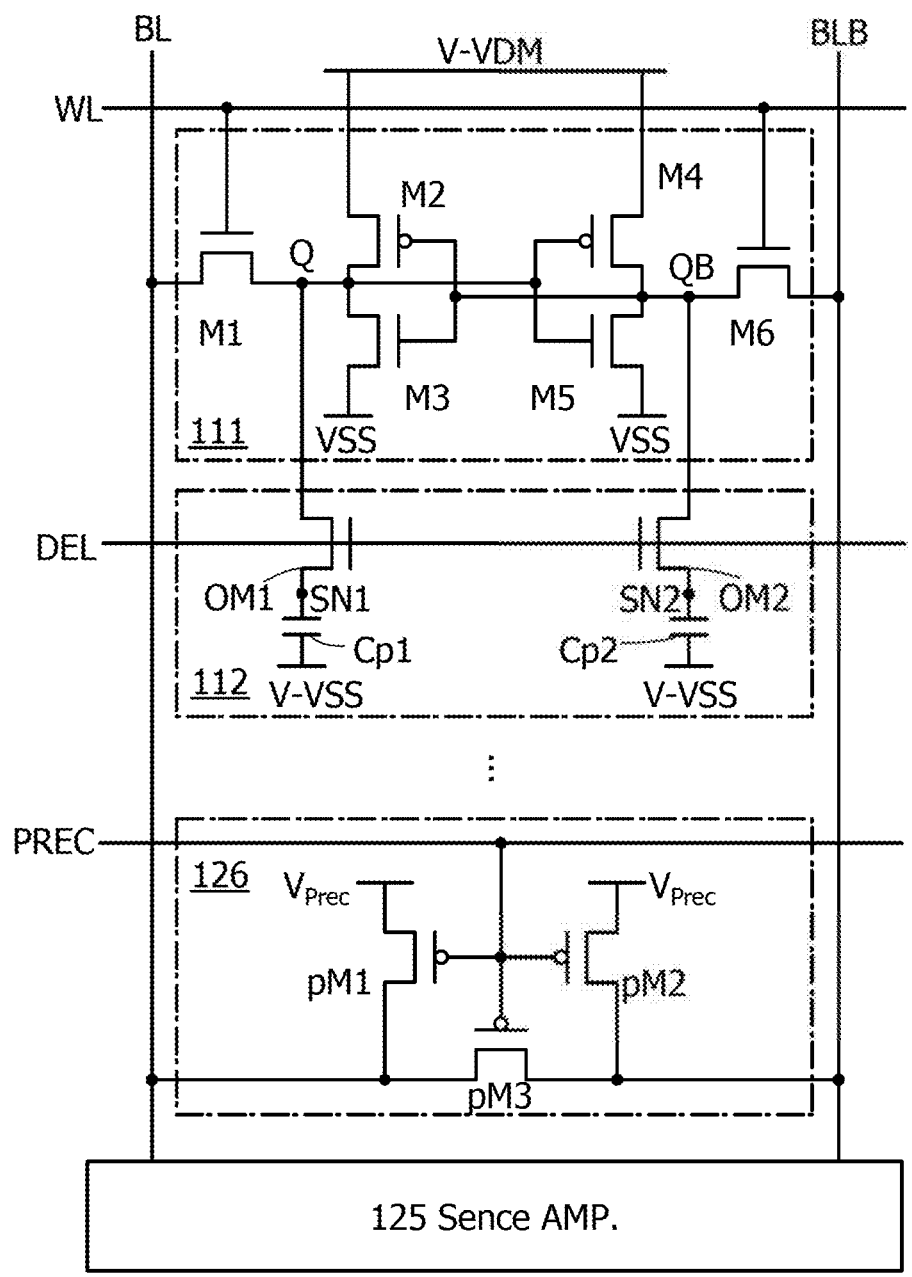
FIG. 8 is a circuit diagram for describing one embodiment of the present invention.

The precharge circuit 126 shown in FIG. 8 is provided for each pair of the bit line BL and the inverted bit line BLB connected to the memory cell MC. The precharge circuit 126 includes transistors pM1 to pM3, for example. The transistors pM1 to pM3 are p-channel transistors.

Figure 9:
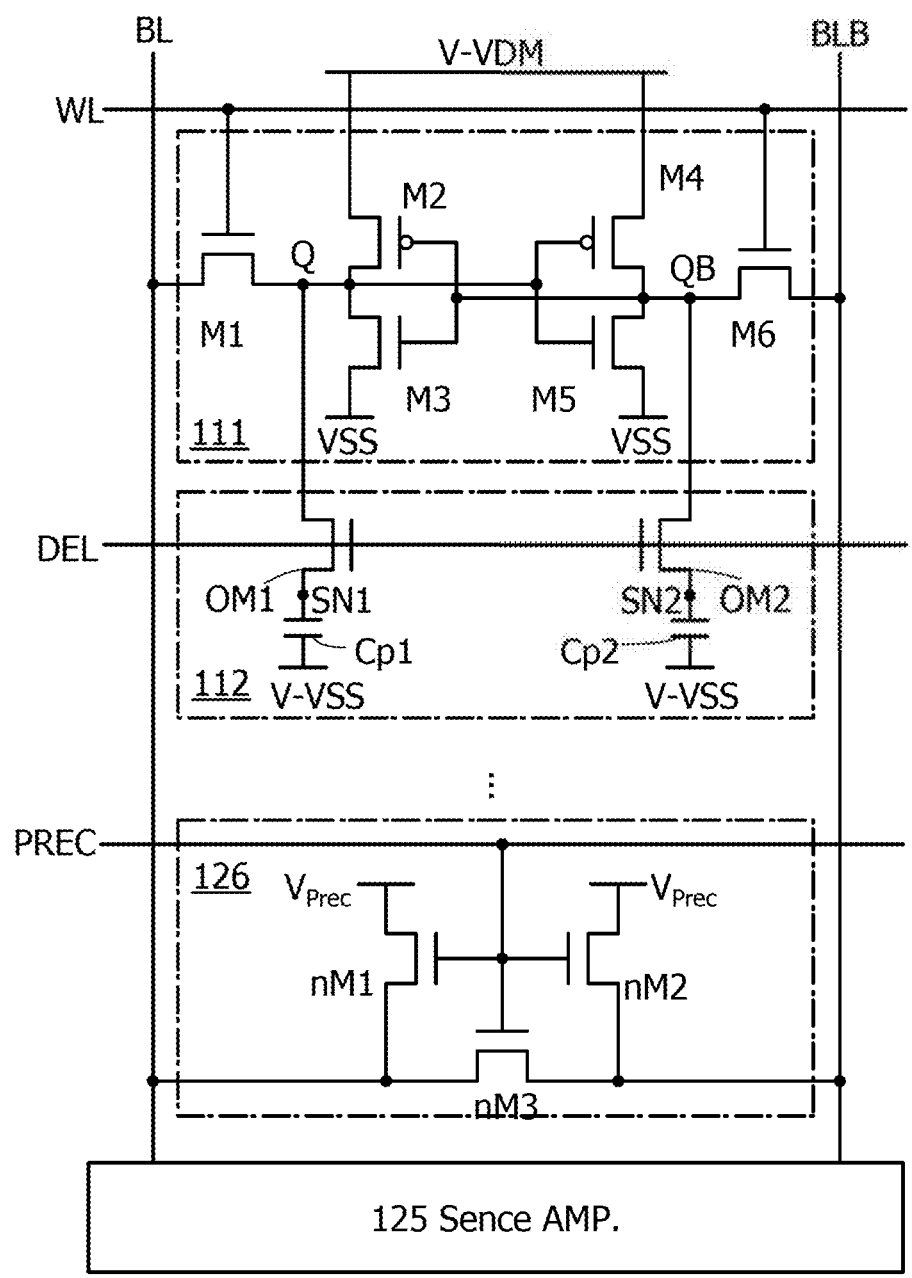
FIG. 9 is circuit diagram for describing one embodiment of the present invention.
Figure 10:
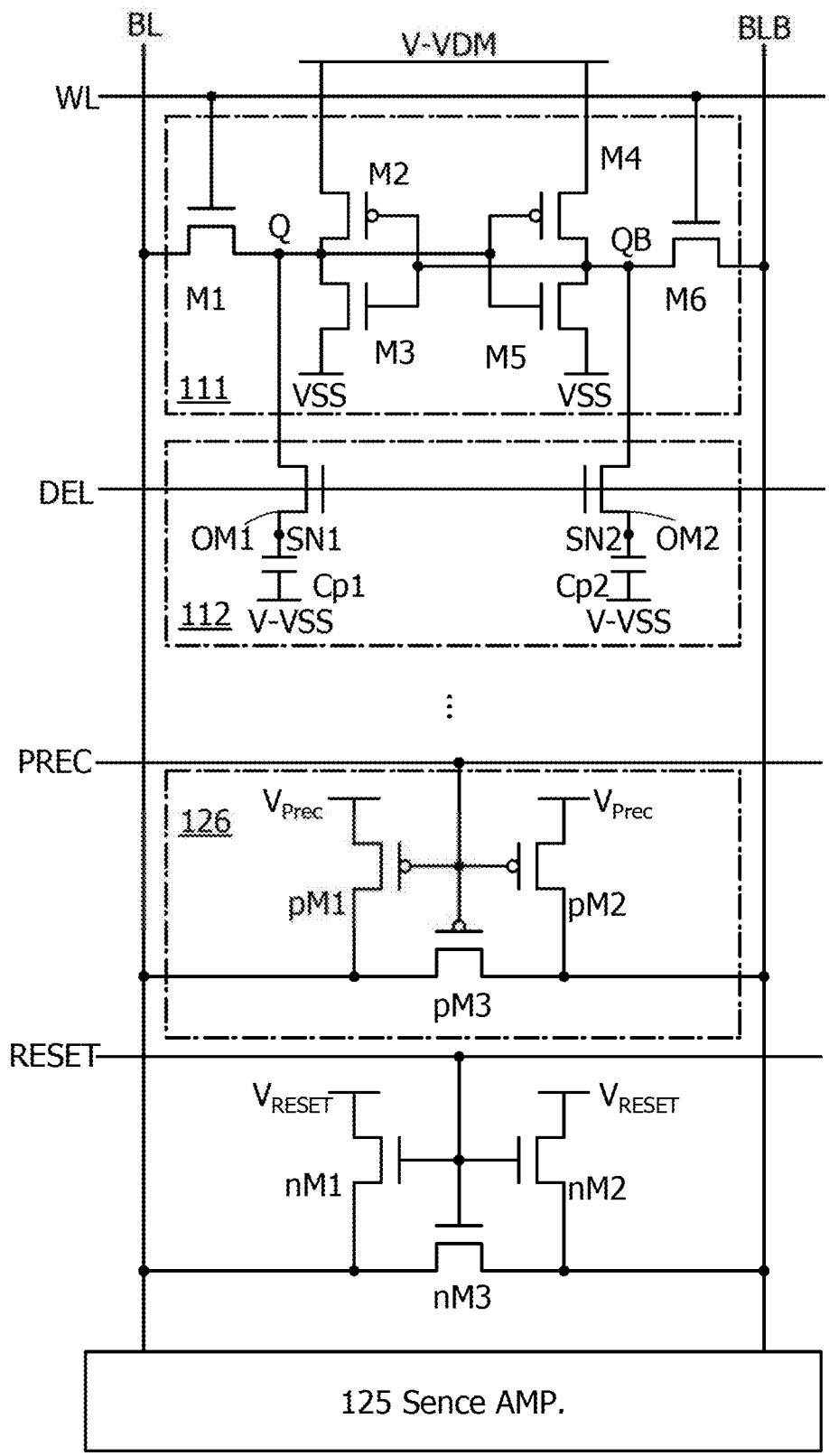
FIG. 10 is a circuit diagram for describing one embodiment of the present invention.

The precharge circuit 126 may include n-channel transistors nM1 to nM3 as shown in FIG. 9. Alternatively, the precharge circuit 126 has a configuration in which a voltage which is not the precharge voltage $V_{Prec}$ can be supplied to the bit line and the inverted bit line. For example, as shown in FIG. 10, a configuration in which transistors nM1 to nM3 are provided in addition to the transistors pM1 to pM3 and a reset voltage $V_{RESET}$ is supplied by control of a reset control signal RESET may be used.

A precharge control signal PREC is supplied to gates of the transistors pM1 to pM3. By turning on the transistors pM1 to pM3, the precharge voltage $V_{Prec}$ can be supplied to the bit line BL and the inverted bit line BLB, and the bit line BL and the inverted bit line BLB can have the same potential. Furthermore, by turning off the transistors pM1 to pM3, the bit line BL and the inverted bit line BLB can be brought into an electrically floating state.

<Specific Example of Backup/Recovery Driver Circuit>

A specific example of the backup/recovery driver circuit 130 shown in FIG. 1 is described.

Figure 11:
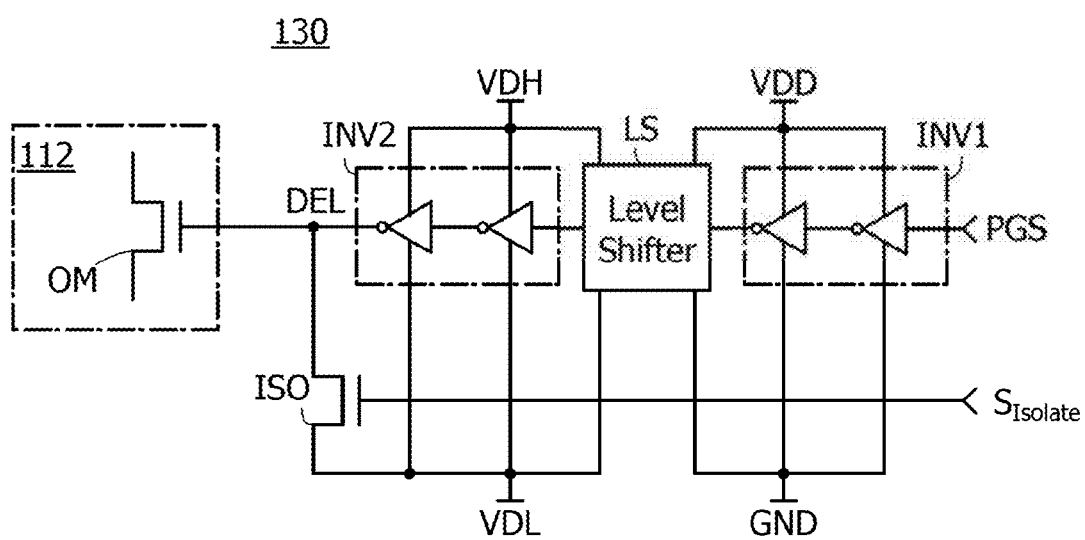
FIG. 11 is a circuit diagram for describing one embodiment of the present invention.

The backup/recovery driver circuit 130 shown in FIG. 11 includes an inverter INV1, a level shifter LS, an inverter INV2, and as transistor ISO. The inverter INV1 is supplied with the power supply voltage VDD/GND. The inverter INV2 is supplied with the power supply voltage VDH/VDL. The level shifter LS is supplied with the power supply voltage VDD/GND and the power supply voltage VDH/VDL.

The power gating signal PGS is input to the backup/recovery driver circuit 130. The voltage of the power gating signal PGS is raised (or lowered) in the level shifter LS through the inverter INV1 serving as a buffer. The raised (or lowered) voltage of the power gating signal PGS is supplied to the data control line DEL through the inverter INV2 serving as a buffer. A transistor OM for storing charges in the nonvolatile memory portion 112 can be turned on or off by the potential of the data control line DEL.

The transistor ISO has a function of setting the data control line DEL at the potential VDL using a signal $S_{Isolate}$. With the configuration, the data control line DEL can be reliably set at the potential VDL using the transistor ISO even in the case where power gating is performed on the backup/recovery driver circuit 130.

Embodiment 3

In this embodiment, the OS transistor described in the above embodiments will be described.

<Off-state Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8\times10^{11}/cm^3$, preferably lower than $1\times10^{11}/cm^3$, further preferably lower than $1\times10^{10}/cm^3$, and is higher than or equal to $1\times10^{-9}/cm^3$. In the oxide semiconductor, hydrogen, nitrogen, carbon, silicon, and a metal element other than a main component are impurities. For example, hydrogen and nitrogen form donor levels to increase the carrier density.

A transistor using an intrinsic or substantially intrinsic oxide semiconductor has a low carrier density and thus is less likely to have a negative threshold voltage. In addition, the transistor including the oxide semiconductor has small variation in electrical characteristics and high reliability because of few carrier traps in the oxide semiconductor. Furthermore, a transistor including the oxide semiconductor can have an extremely low off-state current.

Note that the OS transistor with a reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

The case where a data voltage of 4-bit data is retained in the node FN2 is described, for example. In the case where the power source voltage is higher than or equal to 2 V and lower than or equal to 3.5 V, the storage capacitance is 0.1 fF, the distribution width of the retained voltage is lower than 30 mV, and the allowable amount of change in the retained voltage is lower than 80 mV, the leakage current from the node FN2 needs to be lower than $0.025\times10^{-24}$ A in order that a change in the retained voltage is smaller than the allowable amount of change at 85° C. for 10 years. In the case where leakage current from other portions is further small and the leakage portions are mostly in an OS transistor, when the channel width of the OS transistor is 60 nm, the leakage current per unit area of the OS transistor is preferably lower than $0.423\times10^{-24}$ A/μm. The memory cell MC can retain data at 85° C. for 10 years when the above specifications are satisfied.

<Off-state Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. For this reason, when there is $V_{gs}$ at which the off-state current of a transistor is lower than or equal to I, it may be said that the off-state current of the transistor is lower than or equal to I. The off-state current of a transistor may refer to an off-state current at given $Y_{gs}$, off-state current at $V_{gs}$ in a given range, or off state current at $V_{gs}$ at which sufficiently low off-state current is obtained.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the unit of off-state current may be represented by current per length (e.g., m A/μm).

The off-state current of a transistor depends on temperature in some cases. Unless of specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is $V_{gs}$ at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on a voltage $V_{ds}$ between its drain and source in some cases. Unless otherwise specified, the off-state current in this specification may be an off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. When there is $V_{gs}$ at which the off-state current of a transistor is lower than or equal to I at given $V_{ds}$, it may be said that the off-state current of the transistor is lower than or equal to I. Here, given $V_{ds}$ is, for example, 0.1 V, 0.8 V, 1 V, 1.2 V, 1.8 V, 2.5 V, 3 V, 3.3 V, 10 V, 12 V, 16 V, 20 V, $V_{ds}$ at which the reliability of a semiconductor device or the like including the transistor is ensured, or $V_{ds}$ used in the semiconductor device or the like.

In the above description of the off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf-Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide, with an atomic ratio of In:Ga:Zn=1:1:1, In:Ga:Zn=3:1:2, In:Ga:Zn=4:2:3, or In:Ga:Zn=2:1:3, or an oxide with an atomic ratio close to the above atomic ratios can be used.

<Impurity in Oxide Semiconductor>

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than $8\times10^{11}/cm^3$, preferably lower than $1\times10^{11}/cm^3$, or more preferably lower than $1\times10^{10}/cm^3$, and is higher than or equal to $1\times10^{-9}/cm^3$.

<Structure of Oxide Semiconductor>

Next, a structure of an oxide semiconductor is described.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including $InGaZnO_4$ crystals is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part can be found in some cases. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The OS transistor can achieve extremely favorable off-state current characteristics.

Embodiment 4

In this embodiment, an example of a cross-sectional structure of a transistor used in a memory device included in a semiconductor device of one embodiment of the disclosed invention will be described with reference to FIG. 12A and FIGS. 12B1 to 12B4, FIG. 13, and FIG. 14. In the cross-sectional structure of the transistor described in this embodiment, the transistors M1 to M6, the transistors OM1 and OM2, the capacitors Cp1 and Cp2, and the wirings which are included in the circuit in the memory cell described in Embodiment 2 are shown.

Figure 12:
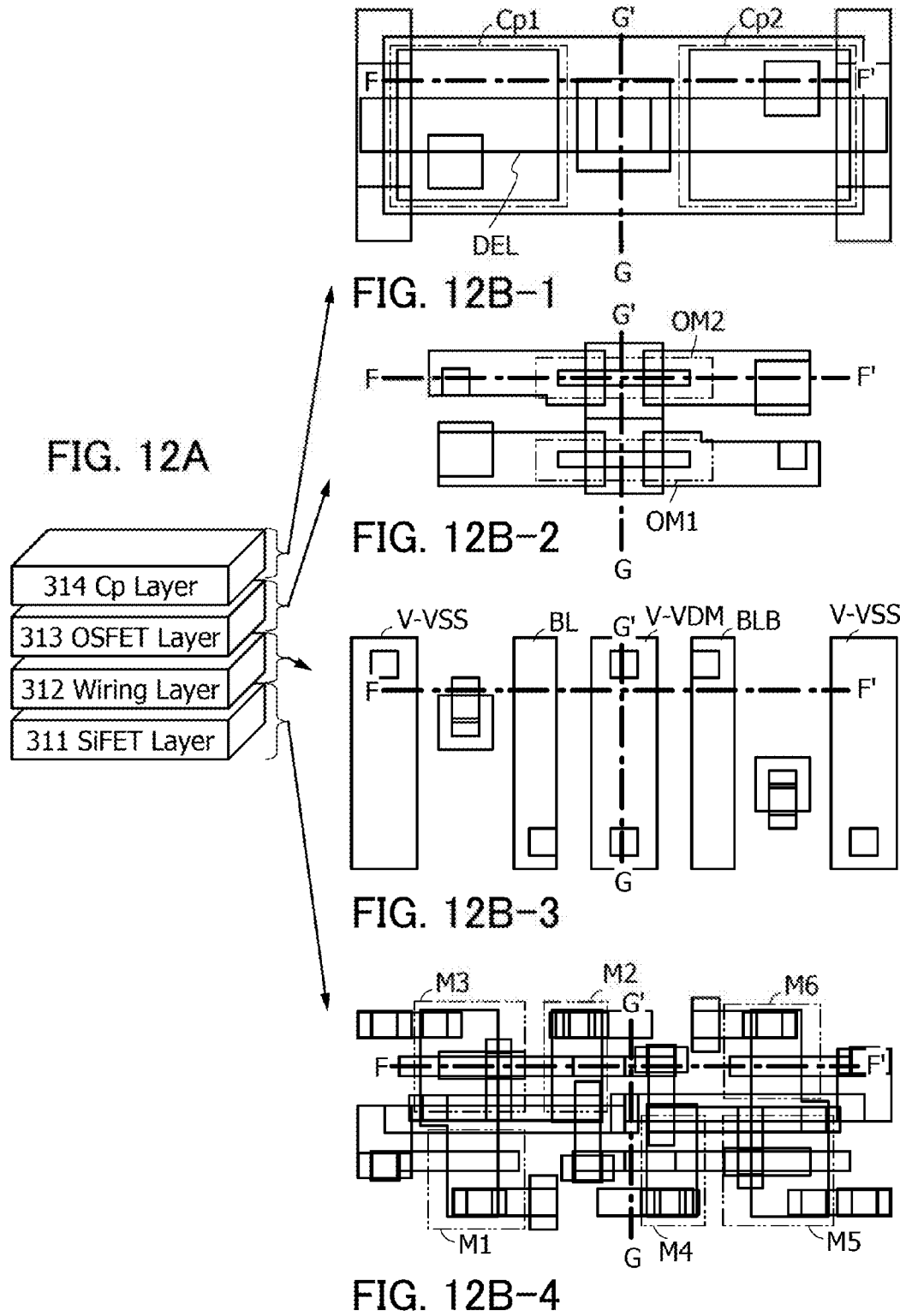

FIG. 12A is a schematic diagram of a layer structure of elements. In FIG. 12A, a first layer 311 is a layer provided with a Si transistor (denoted by SiFET layer). A second layer 312 is a layer provided with a wiring layer (denoted by Wiring layer). A third layer 313 is a layer provided with an OS transistor (denoted by OSFET layer). A fourth layer 314 is a layer provided with a capacitor (denoted by Cp layer).

FIGS. 12B1 to 12B4 are layout diagrams corresponding to the first to fourth layers 311 to 314 in FIG. 12A.

The layout diagram of the fourth layer 314 in FIG. 12B1 corresponds to a layout diagram of the data control line DEL and the capacitors CP1 and Cp2.

The layout diagram of the third layer 313 in FIG. 12B2 corresponds to a layout diagram of the transistors OM1 and OM2.

The layout diagram of the second layer 312 in FIG. 12B3 corresponds to a layout diagram of the power supply potential line V-VSS, the power supply potential line V-VDM, the bit line BL, and the inverted bit line BLB.

The layout diagram of the first layer 311 in FIG. 12B4 corresponds to a layout diagram of the transistors M1 to M6.

With the structure illustrated in FIG. 12A and FIGS. 12B1 to 12B4, the memory device included in the semiconductor device can achieve a layout of a memory cell capable of backing up/recovering data without increasing in area compared to a normal SRAM including six transistors.

Figure 13:
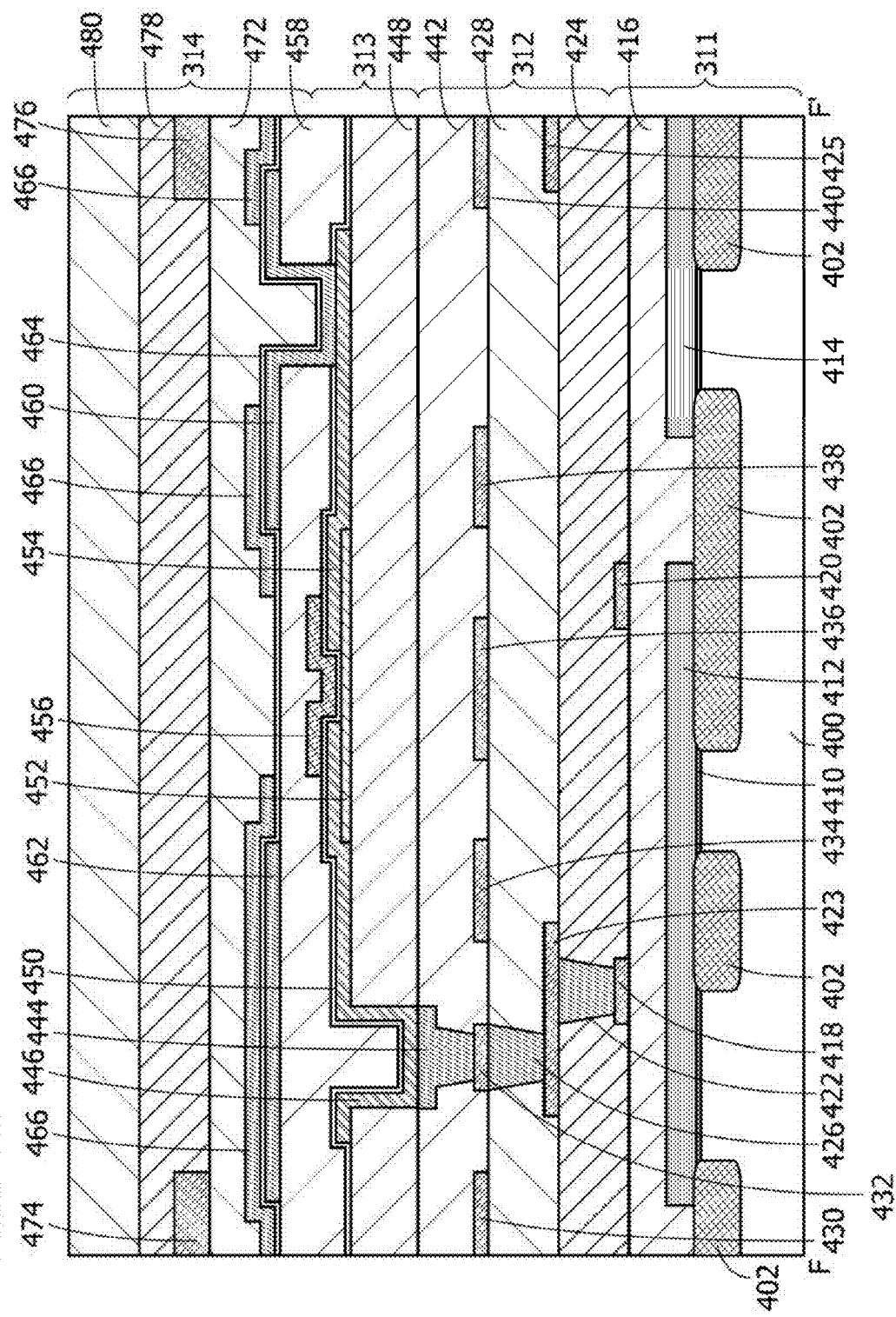
FIG. 13 is a cross-sectional view for describing one embodiment of the present invention.

FIG. 13 is a cross-sectional view taken along dashed-dotted line F-F' in FIG. 12A and FIGS. 12B1 to 12B4, and FIG. 14 is a cross-sectional view taken along dashed-dotted line G-G' in FIG. 12A and FIGS. 12B1 to 12B4.

FIG. 13 shows a semiconductor substrate 400, an element isolation insulating film 402, a gate insulating layer 410, a gate electrode 412, a gate electrode 414, an interlayer insulating layer 416, a wiring layer 425, a wiring layer 418, a wiring layer 420, a conductive layer 422, an interlayer insulating layer 424, a wiring layer 423, a conductive layer 426, an interlayer insulating layer 428, a wiring layer 430, a wiring layer 432, a wiring layer 434, a wiring layer 436, a wiring layer 438, a wiring layer 440, an interlayer insulating layer 442, a conductive layer 444, a wiring layer 446, an interlayer insulating layer 448, a semiconductor layer 452, a gate insulating layer 450, a wiring layer 454, a gate electrode 456, an interlayer insulating layer 458, a conductive layer 460, a conductive layer 462, an insulating layer 464, a conductive layer 466, an interlayer insulating layer 472, a wiring layer 474, a wiring layer 476, an interlayer insulating layer 478, and an interlayer insulating layer 480.

Figure 14:
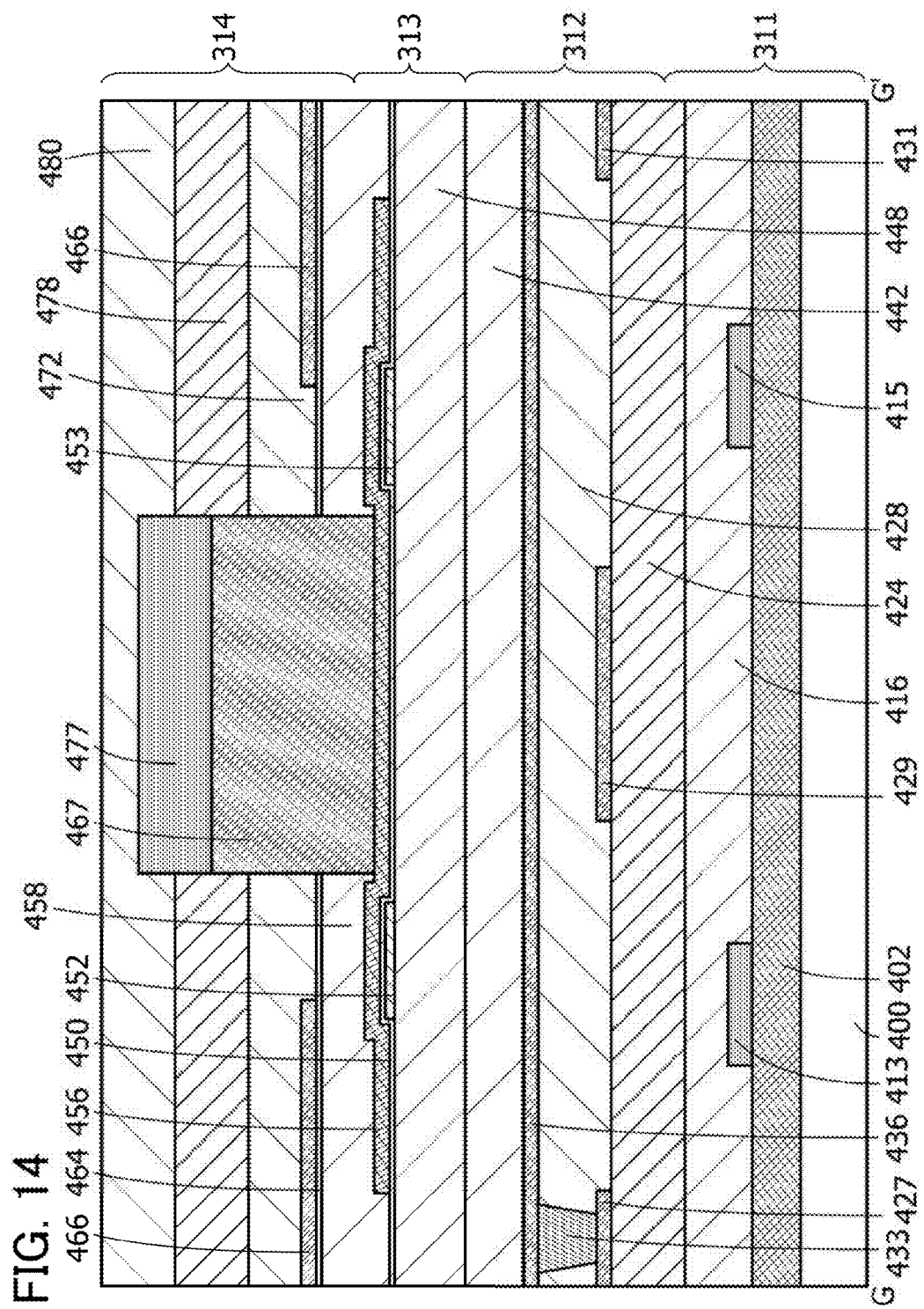
FIG. 14 is a cross-sectional view for describing one embodiment of the present invention.

FIG. 14 shows the semiconductor substrate 400, the element isolation insulating film 402, a gate electrode 413, a gate electrode 415, the interlayer insulating layer 416, the interlayer insulating layer 424, a wiring layer 427, a wiring layer 429, a wiring layer 431, a conductive layer 433, the interlayer insulating layer 428, the wiring layer 436, the interlayer insulating layer 442, the interlayer insulating layer 448, the semiconductor layer 452, a semiconductor layer 453, the gate insulating layer 450, the gate electrode 456, the interlayer insulating layer 458, the insulating layer 464, the conductive layer 466, the interlayer insulating layer 472, the interlayer insulating layer 478, a conductive layer 467, a wiring layer 477, and the interlayer insulating layer 480.

The semiconductor substrate 400 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor in the first layer 311 is electrically isolated from another transistor by the element isolation insulating film 402. The element isolation insulating film 402 can be formed by a local oxidation of silicon (LOCOS) method, a trench isolation method, or the like.

The gate insulating layer 410 is formed in such a manner that a surface of the semiconductor substrate 400 is oxidized by heat treatment, so that a silicon oxide film is formed, and then part of the silicon oxide film is selectively etched. Alternatively, the gate insulating layer 410 is formed in such a manner that silicon oxide, silicon oxynitride, a metal oxide such as hafnium oxide, which is a high dielectric constant material (also referred to as a high-k material), or the like is formed by a CVD method, a sputtering method, or the like and then part thereof is selectively etched.

Each of the gate electrodes 412, 413, 414, 415, and 456, the wiring layers 418, 420, 423, 427, 429, 430, 431, 432, 434, 436, 438, 440, 446, 454, 474, 476, and 477, and the conductive layers 422, 426, 433, 444, 460, 462, 466, and 467 is preferably formed using a metal material such as aluminum, copper, titanium, tantalum, or tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the interlayer insulating layers 416, 424, 428, 442, 448, 458, 472, 478, and 480 and the insulating layer 464 is preferably a single layer or a multilayer including an inorganic insulating layer or an organic insulating layer. The inorganic insulating layer preferably has a single-layer structure or a layered structure including any of a silicon nitride film, a silicon oxynitride film, a silicon nitride oxide film, and the like. The organic insulating layer is preferably a single layer or a multilayer formed using a polyimide, acrylic, or the like. There is no particular limitation on a method for forming each of the insulating layers; for example, a sputtering method, an MBE method, a PE-CVD method, a pulsed laser deposition method, an atomic layer deposition (ALD) method, or the like can be employed as appropriate.

Each of the semiconductor layers 452 and 453 can be a single layer or a stacked layer formed using an oxide semiconductor. The oxide semiconductor is an oxide film containing at least indium, gallium, and zinc, such as an In—Ga—Zn-based oxide (also referred to as IGZO). Note that the In—Ga—Zn-based oxide means an oxide containing In, Ga, and Zn, and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an ALD method, an evaporation method, a coating method, or the like.

The gate insulating layer 450 is preferably a single layer or a multilayer including an inorganic insulating layer. The gate insulating layer 450 preferably has an effect of supplying oxygen to the semiconductor layers 452 and 453.

With the structure in FIG. 13 and FIG. 14, the power supply potential line V-VDM and channel formation regions of the transistors OM1 and OM2 can be stacked in the memory device included in the semiconductor device. The power supply potential of the power supply potential line V-VDM is set to a high power supply potential in the case where the power supply voltage is supplied to the memory device. In that case, with the use of the power supply potential line V-VDM for back gates of the transistors OM1 and OM2, on-state currents of the transistors OM1 and OM2 can be increased. In contrast, the power supply potential of the power supply potential line V-VDM is set to a low power supply potential in the case where the power supply voltage is not supplied to the semiconductor device. In that case, with the use of the power supply potential line V-VDM for the back gates of the transistors OM1 and OM2, characteristic such as low off-state currents of transistors Tr1 and Tr2 is not inhibited. Therefore, the on-state currents of the transistors OM1 and OM2 can be increased and the off-state currents thereof can be kept low.

Note that the structures, methods, and the like described in this embodiment can be used as appropriate in combination with any of the structures, methods, and the like described in the other embodiments.

Embodiment 5

Although the conductive layer and the semiconductor layer described in the above embodiments can be formed by a sputtering method, they may be formed by another method, for example, a thermal CVD method. Examples of a thermal CVD method include a metal organic chemical vapor deposition (MOCVD) method and an atomic layer deposition (ALD) method.

A thermal CVD method has an advantage that no defect due to plasma damage is generated because it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure, or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced such that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film and the semiconductor film described in the above embodiments can be formed by a thermal CVD method such as a MOCVD method or an ALD method. For example, trimethylindium, trimethylgallium, and dimethylzinc are used to form an In—Ga—Zn—$O_X$ film (X>0). Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are sequentially introduced multiple times, so that a tungsten film is formed. Note that a $SiH_4$ gas may be used instead of a $B_2H_6$ gas.

In the case where an oxide semiconductor film, for example, an $InGaZnO_X$ film (X>0) is formed with a deposition apparatus employing an ALD method, an $In(CH_3)_3$ gas and an $O_3$ gas are sequentially introduced more than once to form an $InO_2$ layer, a $Ga(CH_3)_3$ gas and an $O_3$ gas are sequentially introduced to form a GaO layer, and then a $Zn(CH_3)_2$ gas and an $O_3$ gas are sequentially introduced to form as ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas that is obtained by bubbling with an inert gas such as Ar may be used instead of an $O_3$ gas, it is preferable to use an $O_3$ gas that does not contain H. Instead of an $In(CH_3)_3$ gas, an $In(C_2H_5)_3$ gas may be used instead of a $Ga(CH_3)_3$ gas, a $Ga(C_2H_5)_3$ gas may be used. Alternatively, a $Zn(CH_3)_2$ gas may be used.

Embodiment 6

In this embodiment, application examples of the memory device described in the above embodiments to an electronic component and to an electronic device including the electronic component are described with reference to FIGS. 15A and 15B and FIGS. 16A to 16E.

Figure 15A:
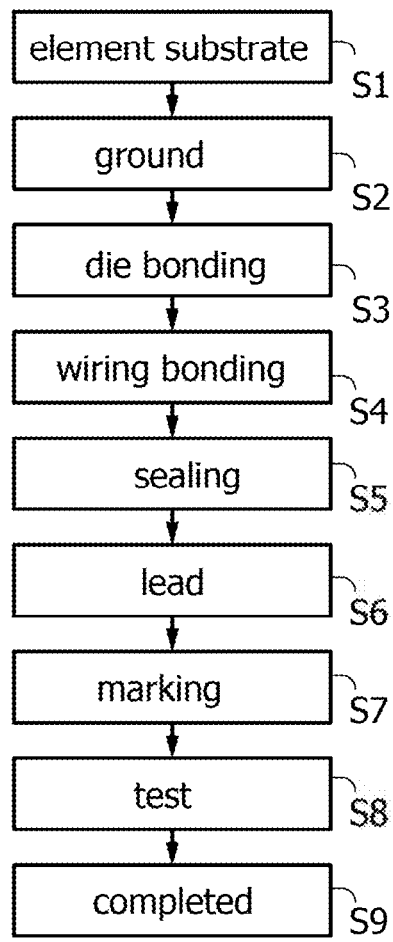
FIG. 15A is a flowchart showing a manufacturing process of an electronic component.

FIG. 15A shows an example where the memory device described in the above embodiments is used to manufacture an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A memory device including the transistors illustrated in FIG. 12A, FIGS. 12B1 to 12B4, FIG. 13, and FIG. 14 in Embodiment 5 is completed by integrating detachable components on a printed circuit board through the assembly process (post-process).

The post-process can be completed through steps shown in FIG. 15A. Specifically, after an element substrate obtained in the preceding process is completed (Step S1), a back surface of the substrate is ground (Step S2). The substrate is thinned in this step to reduce a warp or the like of the substrate in the preceding process and to reduce the size of the component itself.

After grinding the back surface of the substrate, a dicing step is performed to separate the substrate into a plurality of chips. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above electronic component can include the memory device described in the above embodiments. Thus, the electronic component which achieves reduction in power consumption can be obtained.

Figure 15B:
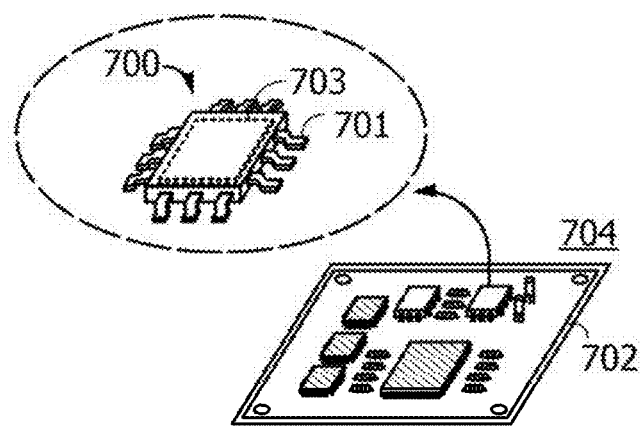
FIG. 15B is a schematic perspective view of the electronic component.

FIG. 15B is a schematic perspective view of the completed electronic component. FIG. 15B is a schematic perspective view illustrating a quad flat package (QFP) as an example of the electronic component. A lead 701 and a circuit portion 703 of an electronic component 700 are illustrated in FIG. 15B. The electronic component 700 in FIG. 15B is, for example, mounted on a primed circuit board 702. When a plurality of electronic components 700 are used in combination and electrically connected to each other over the printed circuit board 702, the electronic components 700 can be mounted on an electronic device. A completed semiconductor device 704 is provided in the electronic device or the like.

Then, applications of the electronic component to an electronic device such as a computer, a portable information terminal (including a mobile phone, a portable game machine, an audio reproducing device, and the like), electronic paper, a television device (also referred to as a television or a television receiver), or a digital video camera are described.

Figure 16A:
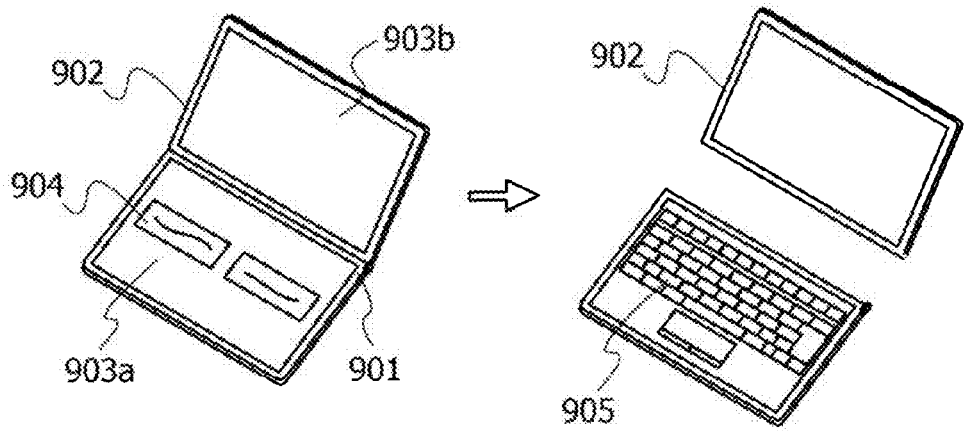
FIGS. 16A to 16E illustrate electronic devices including electronic components.

FIG. 16A illustrates a portable information terminal, which includes a housing 901, a housing 902, a first display portion 903*a*, a second display portion 903*b*, and the like. The semiconductor device described in the above embodiments is provided in at least one of the housings 901 and 902. Thus, the portable information terminal which achieves reduction in power consumption can be obtained.

Note that the first display portion 903*a* is a panel having a touch input function, and for example, as illustrated in the left of FIG. 16A, the "touch input" and the "keyboard input" can be selected by a selection button 904 displayed on the first display portion 903*a*. Since the selection buttons with a variety of sizes can be displayed, the portable information terminal can be easily used by people of any generation. In the case where the "keyboard input" is selected, for example, a keyboard 905 is displayed on the first display portion 903*a* as illustrated in the right of FIG. 16A. With the keyboard 905, letters can be input quickly by keyboard input as in the case of using a conventional information terminal, for example.

Furthermore, one of the first display portion 903*a* and the second display portion 903*b* can be detached from the portable information terminal as illustrated in the right of FIG. 16A. Providing the second display portion 903*b* with a touch input function makes the information terminal convenient to carry because the weight can be further reduced and the information terminal can operate with one hand while the other hand supports the housing 902.

The portable information terminal in FIG. 16A can have a function of displaying various kinds of information (e.g., a still image, a moving image, and a text image), a function of displaying a calendar, a date, the time or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 16A may transmit and receive data wirelessly. Through wireless communication, desired book data or the like can be purchased and downloaded from an electronic book server.

Furthermore, the housing 902 in FIG. 16A may have an antenna, a microphone function, or a wireless communication function to be used as a mobile phone.

Figure 16B:
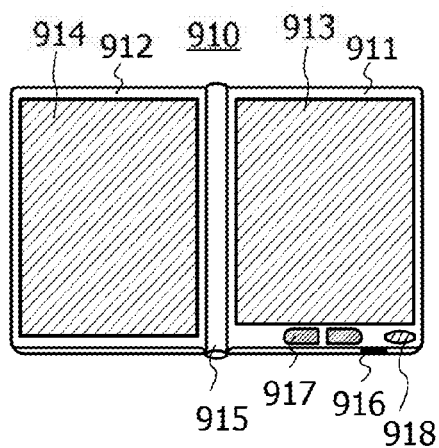

FIG. 16B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened and closed with the hinge portion 915 as an axis. The housing 911 is provided with a power switch 916, an operation key 917, a speaker 918, and the like. The semiconductor device is provided in at least one of the housings 911 and 912. Thus, the e-book reader which achieves reduction in power consumption can be obtained.

Figure 16C:
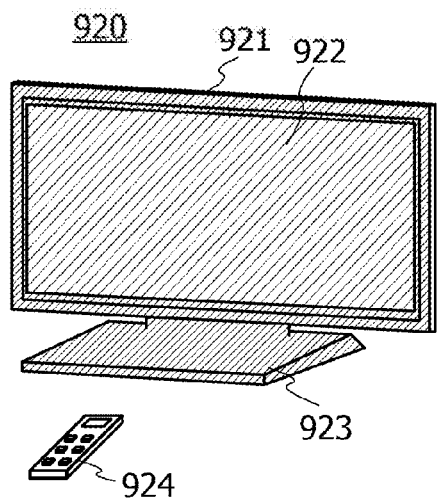

FIG. 16C is a television device, which, includes a housing 921, a display portion 922, a stand 923, and the like. The television device 920 can operate with a switch of the housing 921 and a separate remote controller 924. The semiconductor device described in the above embodiments is provided in the housing 921 and the remote controller 924. Thus, the television device which achieves reduction in power consumption can be obtained.

Figure 16D:
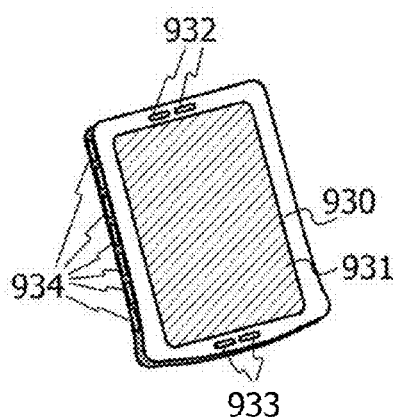

FIG. 16D illustrates a smartphone in which a main body 930 includes a display portion 931, speaker 932, a microphone 933, operation buttons 934, and the like. The semiconductor device described in the above embodiments is provided in the main body 930. Thus, the smart phone which achieves reduction in power consumption can be obtained.

Figure 16E:
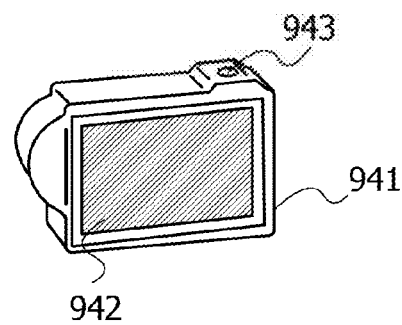

FIG. 16E illustrates a digital camera, which includes a main body 941, a display portion 942, an operation switch 943, and the like. The semiconductor device described in the above embodiments is provided in the main body 941. Thus, the digital camera which achieves reduction in power consumption can be obtained.

As described above, the semiconductor device described in the above embodiments is provided in each of the electronic devices described in this embodiment. Thus, the electronic devices which achieve reduction in power consumption can be obtained (Supplementary Notes on the Description in this Specification and the Like)

The following are notes on the description of the above embodiments and structures in the embodiments.

<Supplementary Notes on One Embodiment of the Present Invention Described in Embodiments>

The structure described in each embodiment can be used as appropriate in combination with any of the structures described in the other embodiments to make another embodiment of the present invention. In addition, in the case where a plurality of structural examples is given in one embodiment, any of the structure examples can be combined as appropriate.

Note that a content (or may be part of the content) described in one embodiment may be applied to combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiment. For example, an example in which a channel formation region, source and drain regions, and the like of a transistor such as the transistor included in the nonvolatile memory portion 112, the transistor OM1, and the transistor OM2 include an oxide semiconductor is described in Embodiment 2 as one embodiment of the present invention; however, one embodiment of the present invention is not limited to this example. Depending on circumstances or conditions, various semiconductors may be included in various transistors, a channel formation region of a transistor, source and drain regions of a transistor, or the like of one embodiment of the present invention. Depending on circumstances or conditions, for example, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, source and drain regions of a transistor, or the like of one embodiment of the present invention. Alternatively, depending on circumstances or conditions, an oxide semiconductor is not necessarily included in various transistors, a channel formation region of a transistor, source and drain regions of a transistor, or the like of one embodiment of the present invention, for example. For example, an example in which a channel formation region, source and drain regions, and the like of a transistor such as the transistor included in the SRAM 111 and the transistors M1 to M6 include silicon is described as one embodiment of the present invention; however, one embodiment of the present invention is not limited to this example. Depending on circumstances or conditions, various semiconductors may be included in various transistors, a channel formation region of a transistor, source and drain regions of a transistor, or the like of one embodiment of the present invention. Depending on circumstances or conditions, for example, at least one of an oxide semiconductor, germanium, silicon germanium, silicon carbide, gallium arsenide, aluminum gallium arsenide, indium phosphide, gallium nitride, an organic semiconductor, and the like may be included in various transistors, a channel formation region of a transistor, source and drain regions of a transistor, or the like of one embodiment of the present invention. Alternatively, depending on circumstances or conditions, silicon is not necessarily included in various transistors, a channel formation region of a transistor, source and drain regions of a transistor, or the like of one embodiment of the present invention, for example.

<Notes on the Description for Drawings>

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

Note that the term "over" or "under" does not necessarily mean that a component is placed directly above or directly below and directly in contact with another component. For example, the expression "electrode B over insulating layer A" does not necessarily mean that the electrode B is above and in direct contact with the insulating layer A and can mean the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, embodiments of the present invention are not limited to such a scale. Note that the drawings are schematically illustrated for clarity, and shapes or values are not limited to those illustrated in the drawings. For example, the following can be included: variation in signal, voltage, or current due to noise or difference in timing.

In a top view (also referred to as a plan view or a layout chart), a perspective view, and the like, some components are not illustrated for clarity of the drawing in some cases.

<Notes on the Description that can be Rephrased>

In this specification or the like, in description of connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, the terms "voltage" and "potential" are interchangeable in appropriate cases. The term "voltage" refers to a potential difference between a given potential and a reference potential. When the reference potential is to ground voltage, the term "voltage" can be replaced with the term "potential". The ground voltage does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

Definitions of terms that are not mentioned in the above embodiments are described below.

<<Switch>>

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micrormirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in the semiconductor when a transistor is on) and a gate overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

<<Channel Width>>

In this specification and the like, a channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Another example of the expressions is, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expressions is "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on expression. Here, X, Y, Z1, and Z2 each denote an object (e.g., a device, an element, a circuit, a wiring, an electrode, a terminal, a conductive film, and a layer).

EXAMPLE

The semiconductor device described in the above embodiment was manufactured. Measurement results of characteristics thereof are described below.

Figure 17:
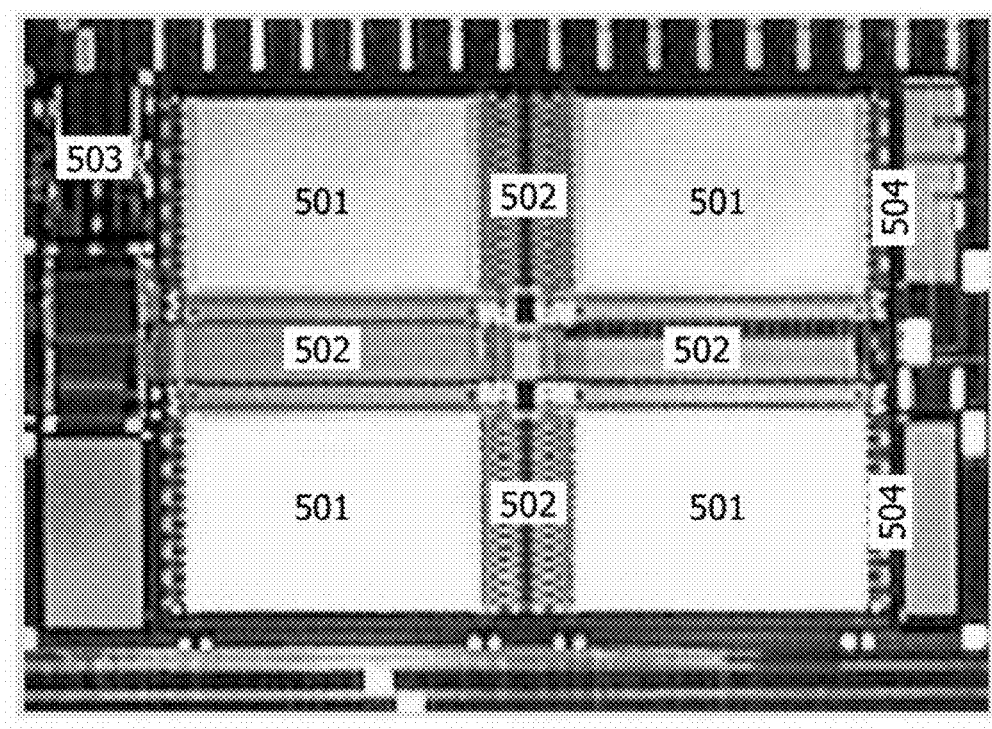
FIG. 17 is a photograph for describing one embodiment of the present invention.

FIG. 17 is a photograph of a chip of the manufactured semiconductor device. The chip photograph of FIG. 17 shows a plurality of sub-arrays 501 obtained by dividing a memory cell array. Peripheral circuits 502, a switch 503, and backup/recovery driver circuits 504 were provided in the periphery of the sub-arrays.

Specifications of the semiconductor device shown in FIG. 17 are as follows. The Si transistor and the OS transistor were manufactured with a 180 nm technology and a 60 nm technology, respectively. The memory cell was 1 k word×32 bit=32 kbit. The frequency was set to 85 MHz. As the power supply voltages, VDD/GND was set to 1.8/0 V, and VDH/VDL was set to 2.5/−1 V.

Figure 18A:
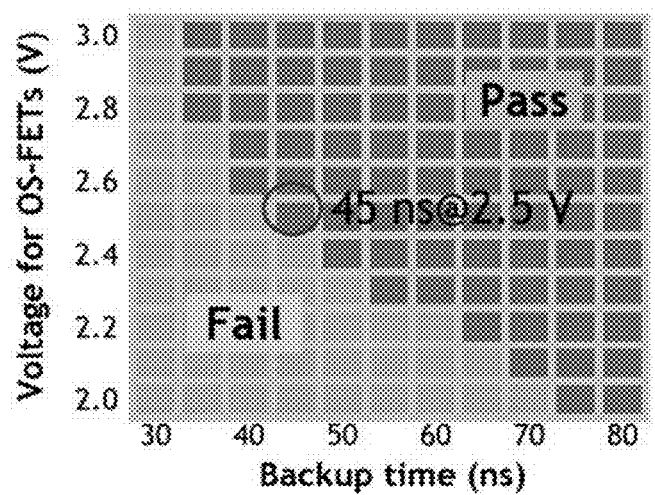
FIGS. 18A and 18B are Shmoo plots for describing one embodiment of the present invention.
Figure 18B:
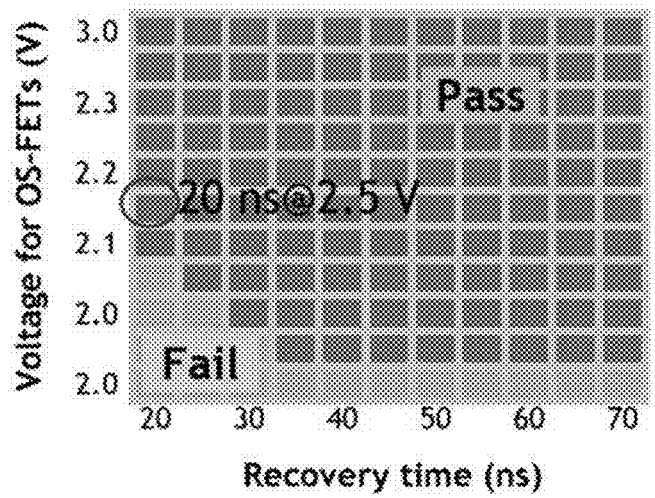

FIG. 18A is a Shmoo plot of data backup from an SRAM to a nonvolatile memory portion. FIG. 18B is a Shmoo plot of data recovery from the nonvolatile memory portion to the SRAM. In each of FIGS. 18A and 18B, the correlation between required time and the level of a voltage applied to the data control line DEL is shown.

It is shown from FIG. 18A that data backup is performed without problems when the backup time is 45 ns and the voltage is 2.5 V. It is shown from FIG. 18B that data recovery is performed without problems when the recovery time is 67 ns and the voltage is 2.0 V. The backup time and the recovery time are extremely shorter than a period for state switching and are so short as to cause no problem.

Figure 19:
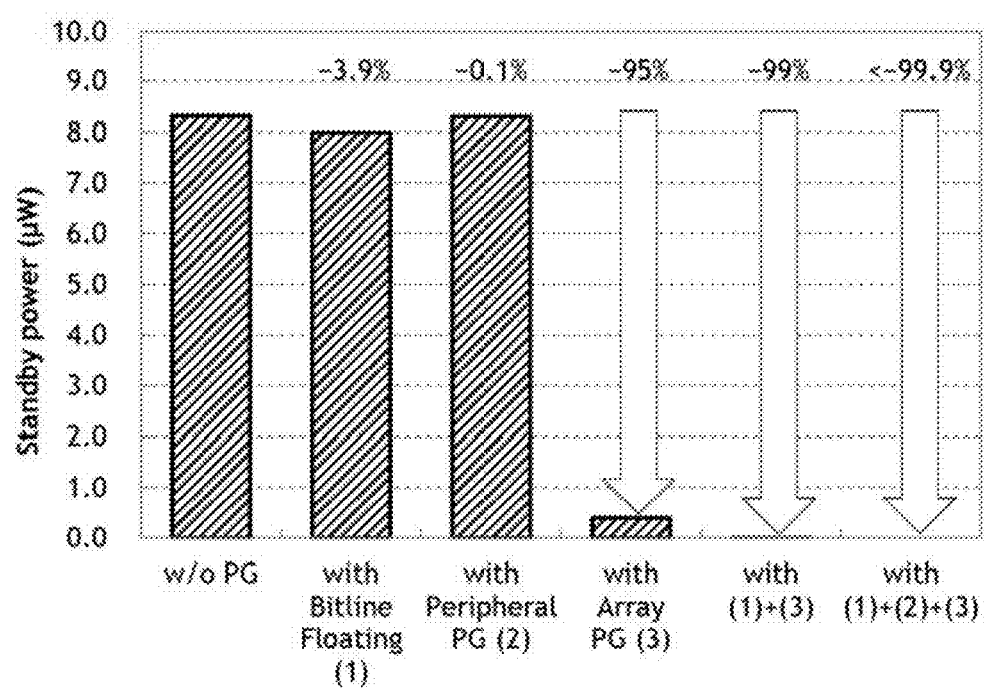
FIG. 19 is a graph for describing one embodiment of the present invention.

FIG. 19 is a graph showing changes in standby power in the first state (denoted by "With Bitline Floating (1)"), the second state (denoted by "(1)+(3)"), the third state (denoted by "(1)+(2)+(3)"), power gating for only the peripheral circuits (denoted by "With Peripheral PG (2)"), and power gating for only the memory cell array (denoted by "With Array PG (3)"), relative to the standby state (denoted by "W/O PG") described in Embodiment 1.

As shown in FIG. 19, the effect of power consumption reduction by the first to third states is high. Although the power gating for only the memory cell array can reduce power consumption, it is shown that the combination of the Bitline Floating with the power gating for only the memory cell array can reduce power consumption more.

Figure 20A:
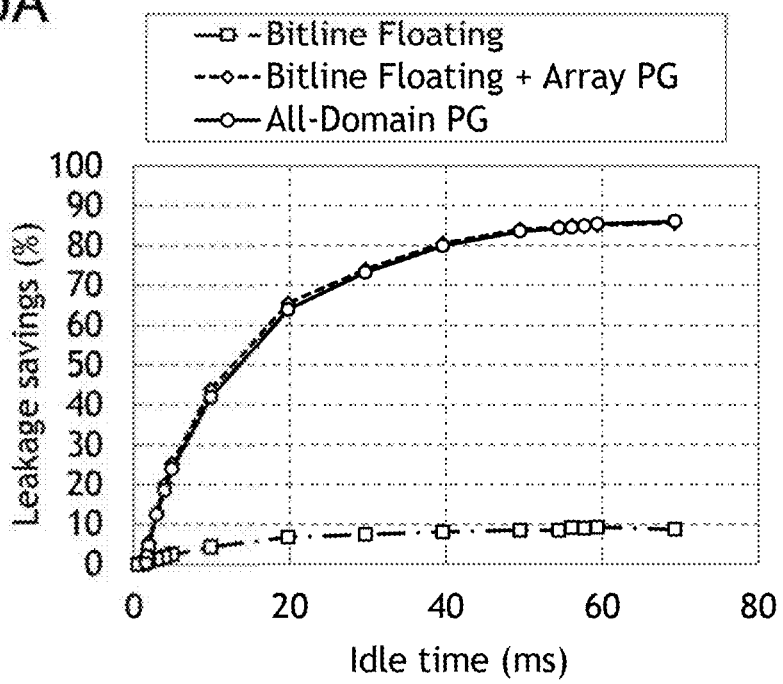
FIGS. 20A to 20C are graphs for describing one embodiment of the present invention.
Figure 20B:
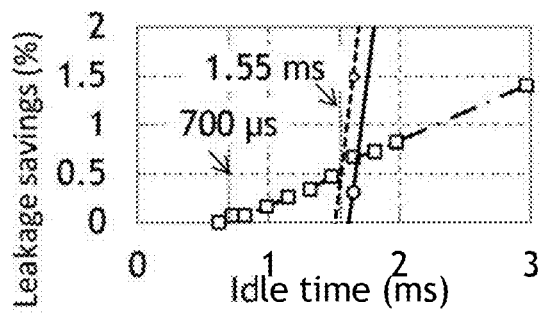
Figure 20C:
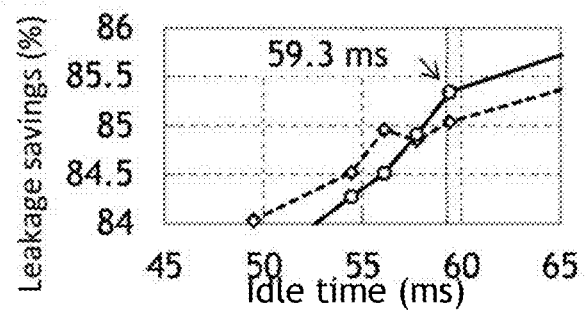

FIGS. 20A to 20C are graphs showing the degree of a reduction in power consumption in the first to third states with respect to a non-access period to the cache, i.e., idle time. In FIGS. 20A to 20C the horizontal axis indicates idle time (Idle time) and the vertical axis indicates leakage power savings (Leakage savings). As the leakage power savings are larger, power consumption can be reduced more.

Note that the first state, the second state, and the third state are denoted by "Bitline Floating", "Bitline Floating+Array PG", and "All Domain PG", respectively. In FIG. 20B, a region from 0 ms to 3 ms in FIG. 20A is enlarged. In FIG. 20C, a region from 45 ms to 65 ms in FIG. 20A is enlarged.

As shown in FIGS. 20A to 20C, the leakage power savings in the first state are increased after the idle time of 700 μs. The leakage power savings in the second state or the third state are increased more than the leakage power savings in the first state after the idle time of 1.55 ms. The leakage power savings in the third state are increased more than the leakage power savings in the second state after the idle time of 59.3 ms.

In other words, it is found that the first state provides the benefit of reducing power consumption when the idle time is longer than 700 µs and shorter than or equal to 1.6 ms. It is found that the second state provides the benefit of reducing power consumption when the idle time is longer than 1.6 ms and shorter than or equal to 60 ms. It is found that the third state provides a great benefit of reducing power consumption when the idle time is longer than 60 ms. Thus, state switching depending on the length of the idle time was found effective.

Figure 21:
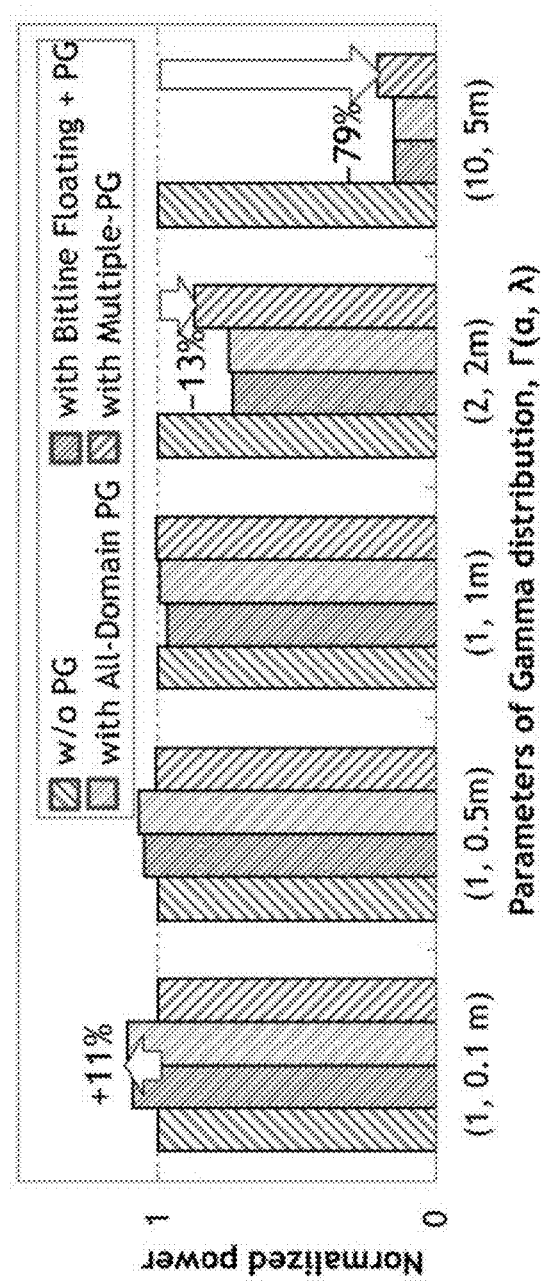
FIG. 21 is a graph for illustrating one embodiment of the present invention.

FIG. 21 shows graphs of the degree of power consumption obtained when power consumption in the standby state is 1. It was assumed that the idle time obeyed Gamma distribution ($\Gamma(\alpha, \lambda)$), which is a model for describing internet traffic behavior (Poisson process).

In FIG. 21, the mode of the above embodiment (denoted by "with multiple PG") in which the first to third states are switched in accordance with idle time is shown. In addition, a mode (denoted by "with Bitline Floating+PG") in which power gating is performed only in the second state and a mode (denoted by "with All-Domain PG") in which power gating is performed only in the third state are shown as comparative examples. As conditions of $\Gamma(\alpha, \lambda)$, (1, 0.1 m), (1, 0.5 m), (1, 1 m), (2, 2 m), and (10, 5 m) are shown in FIG. 21.

It is shown from FIG. 21 that the mode of the above embodiment does not increase power consumption under any of the above conditions and has the highest effect of reducing power consumption under a variety of conditions.

This application is based on Japanese Patent Application serial no. 2015-012635 filed with Japan Patent Office on Jan. 26, 2015, the entire contents of which are hereby incorporated by reference.

What is claimed is:

1. A semiconductor device comprising:
   a memory device including a memory cell array, a drive control circuit, a data control circuit, and first to fourth switches; and
   a power supply voltage control circuit,
   wherein the memory cell array includes a memory cell,
   wherein the memory cell includes a first memory portion and a second memory portion,
   wherein the drive control circuit is configured to read data by precharging a bit line and an inverted bit line, the bit line and the inverted bit line being electrically connected to the first memory portion,
   wherein the data control circuit is configured to store and restore data between the first memory portion and the second memory portion by control of the power supply voltage control circuit,
   wherein the power supply voltage control circuit is configured to control on or off of the first to fourth switches,
   wherein the first switch is configured to bring the bit line and the inverted bit line into an electrically floating state by being turned off,
   wherein the second switch is configured to stop supply of a first power supply voltage to the memory cell array by being turned off,
   wherein the third switch is configured to stop supply of a second power supply voltage to the drive control circuit by being turned off,
   wherein the fourth switch is configured to stop supply of a third power supply voltage to the data control circuit by being turned off, and
   wherein the power supply voltage control circuit is configured to switch between a first state in which the first switch is off, a second state in which the first and second switches are off, and a third state in which the first to fourth switches are off.

2. The semiconductor device according to claim 1,
   wherein the first memory portion includes an SRAM,
   wherein the second memory portion includes a first transistor and a capacitor,
   wherein the first transistor includes an oxide semiconductor in a semiconductor layer, and
   wherein the first transistor is configured to be turned on or off by the data control circuit.

3. The semiconductor device according to claim 2,
   wherein the SRAM includes a second transistor, and
   wherein the second transistor includes silicon in a semiconductor layer.

4. The semiconductor device according to claim 3,
   wherein a channel region of the first transistor and a channel region of the second transistor overlap with each other.

5. The semiconductor device according to claim 1,
   wherein the third power supply voltage is larger than the first power supply voltage or the second power supply voltage.

6. The semiconductor device according to claim 1,
   wherein the data control circuit includes a level shifter.

7. An electronic component comprising:
   the semiconductor device according to claim 1; and
   a lead electrically connected to the semiconductor device.

8. An electronic device comprising:
   the electronic component according to claim 7; and
   a display device.

* * * * *